(12) United States Patent
Jang et al.

(10) Patent No.: US 12,503,646 B2
(45) Date of Patent: Dec. 23, 2025

(54) QUANTUM DOT DEVICE, FILM HAVING MULTILAYERED STRUCTURE, AND ELECTRONIC DEVICE

(71) Applicants: Samsung Electronics Co., Ltd., Suwon-si (KR); The Governing Council of the University of Toronto, Toronto (CA)

(72) Inventors: Eun Joo Jang, Suwon-si (KR); Kwanghee Kim, Seoul (KR); Seungjin Lee, Toronto (CA); Ted Sargent, Toronto (CA)

(73) Assignees: SAMSUNG ELECTRONICS CO., LTD., Gyeonggi-Do (KR); SAMSUNG DISPLAY CO., LTD., Gyeonggi-Do (KR); THE GOVERNING COUNCIL OF THE UNIVERSITY OF TORONTO, Toronto (CA)

( * ) Notice: Subject to any disclaimer, the term of this patent is extended or adjusted under 35 U.S.C. 154(b) by 815 days.

(21) Appl. No.: 17/689,061

(22) Filed: Mar. 8, 2022

(65) Prior Publication Data
US 2022/0290048 A1     Sep. 15, 2022

(30) Foreign Application Priority Data
Mar. 9, 2021 (KR) .......................... 10-2021-0030908

(51) Int. Cl.
*H01L 51/50* (2006.01)
*C01B 19/04* (2006.01)
(Continued)

(52) U.S. Cl.
CPC .............. *C09K 11/54* (2013.01); *C01B 19/04* (2013.01); *C01G 9/02* (2013.01); *C01G 9/08* (2013.01);
(Continued)

(58) Field of Classification Search
None
See application file for complete search history.

(56) References Cited

U.S. PATENT DOCUMENTS

2005/0208331 A1* 9/2005 Maeda ................ C09K 19/408
                                                           428/917
2020/0105481 A1   4/2020 Bawendi et al.
(Continued)

FOREIGN PATENT DOCUMENTS

CN      104022185 A     9/2014
CN      106784323 A     5/2017
(Continued)

OTHER PUBLICATIONS

Eunjoo Jang et al., "White-Light-Emitting Diodes with Quantum Dot Color Converters for Display Backlights," Adv. Mater. May 31, 2010, pp. 3076-3080, vol. 22.
(Continued)

*Primary Examiner* — Gregory D Clark
(74) *Attorney, Agent, or Firm* — CANTOR COLBURN LLP

(57) ABSTRACT

A quantum dot device, a method of manufacturing the same, a thin film having a multilayered structure, and an electronic device including the same. The quantum dot device includes a first electrode and a second electrode, a quantum dot layer disposed between the first electrode and the second electrode, and a hole transport layer disposed between the quantum dot layer and the first electrode, wherein the hole transport layer includes a first hole transport layer including a three-dimensional structure perovskite thin film and a second hole transport layer including a two-dimensional structure perovskite thin film.

33 Claims, 3 Drawing Sheets

(51) Int. Cl.
  *C01G 9/02* (2006.01)
  *C01G 9/08* (2006.01)
  *C09K 11/54* (2006.01)
  *C09K 11/55* (2006.01)
  *C09K 11/88* (2006.01)
  *H10K 71/12* (2023.01)
  *H10K 85/50* (2023.01)
  *B82Y 20/00* (2011.01)
  *B82Y 40/00* (2011.01)
  *H10K 50/11* (2023.01)
  *H10K 50/115* (2023.01)
  *H10K 50/15* (2023.01)
  *H10K 50/17* (2023.01)
  *H10K 71/40* (2023.01)
  *H10K 101/30* (2023.01)
  *H10K 101/40* (2023.01)
  *H10K 102/00* (2023.01)

(52) U.S. Cl.
  CPC .......... *C09K 11/55* (2013.01); *C09K 11/883* (2013.01); *H10K 71/12* (2023.02); *H10K 85/50* (2023.02); *B82Y 20/00* (2013.01); *B82Y 40/00* (2013.01); *C01P 2004/64* (2013.01); *C01P 2006/60* (2013.01); *H10K 50/11* (2023.02); *H10K 50/115* (2023.02); *H10K 50/156* (2023.02); *H10K 50/171* (2023.02); *H10K 71/40* (2023.02); *H10K 2101/30* (2023.02); *H10K 2101/40* (2023.02); *H10K 2102/00* (2023.02)

(56) References Cited

U.S. PATENT DOCUMENTS

2020/0118767 A1  4/2020  Zhu et al.
2021/0305529 A1  9/2021  Lee et al.

FOREIGN PATENT DOCUMENTS

KR    20160147526 A   12/2016
KR    102062856 B1    1/2020

OTHER PUBLICATIONS

Jiaqi Cheng et al., "Self-Assembled Quasi-3D Nanocomposite: a Novel p-Type Hole Transport Layer for High Performance Inverted Organic Solar Cells," advanced science news, pp. 1-10, vol. 28, No. 1706403.
Krishna P. Acharya et al., "High efficiency quantum dot light emitting diodes from positive aging," Nanoscale, Aug. 25, 2017, pp. 14451-14457, vol. 9.
Peng Chen et al., "In Situ Growth of 2D Perovskite Capping Layer for Stable and Efficient Perovskite Solar Cells," Adv. Funct. Mater., 2018, pp. 1-10, No. 1706923.
Seth Coe et al., "Electroluminescence from single monolayers of nanocrystals in molecular organic devices," Nature, 2002, pp. 800-803, vol. 420.
Shahnawaz et al., "Hole-transporting materials for organic light-emitting diodes: an overview," Journal of Materials Chemistry C, May 16, 2019, pp. 7144-7158, vol. 7.
Tae-Ho Kim et al., "Full-colour quantum dot displays fabricated by transfer printing," Nature Photonics, Feb. 20, 2011, pp. 176-182, vol. 5.
Yu Tian et al., "A Solution-Processed Organometal Halide Perovskite Hole Transport Layer for Highly Efficient Organic Light-Emitting Diodes," Adv. Electron. Mater. Jun. 10, 2016, pp. 1-5, vol. 2, No. 1600165.
Yuanyuan Zhao et al., "Precise stress control of inorganic perovskite films for carbon-based solar cells with an ultrahigh voltage of 1.622 V," Nano Energy, Nov. 12, 2019, pp. 1-9, vol. 67, No. 2020.
Yue Zhang et al., "Efficient red phosphorescent organic light emitting diodes based on solution processed all-inorganic cesium lead halide perovskite as hole transporting layer," Organic Electronics, Aug. 18, 2017, pp. 411-417, vol. 50.
Zheng-Zhen Tang et al., "A Potential Hybrid Hole-Transport Material Incorporating a Redox-Active Tetrathiafulvalene Derivative with CuSCN," Inorganic Chemistry, Nov. 11, 2019, pp. 15824-15831, vol. 58.

\* cited by examiner

QUANTUM DOT DEVICE, FILM HAVING MULTILAYERED STRUCTURE, AND ELECTRONIC DEVICE

CROSS-REFERENCE TO RELATED APPLICATION

This application claims priority to and the benefit of Korean Patent Application No. 10-2021-0030908 filed in the Korean Intellectual Property Office on Mar. 9, 2021, and all the benefits accruing therefrom under 35 U.S.C. § 119, the entire contents of which are incorporated herein by reference.

BACKGROUND

1. Field

Quantum dot devices, thin films having multilayered structures, and electronic devices are disclosed.

2. Description of the Related Art

Physical characteristics (e.g., energy bandgaps, melting points, etc.) of nanoparticles that are known intrinsic characteristics may be controlled by changing particle sizes of the nanoparticles, unlike bulk materials. For example, semiconductor nanocrystals, also known as quantum dots, are supplied with photoenergy or electrical energy and may emit light in a wavelength corresponding to sizes of the quantum dots. Accordingly, the quantum dots may be used as a light emitting body emitting light of a particular wavelength.

SUMMARY

A quantum dot device may use quantum dots as a light emitting body. However, since quantum dots may differ from conventional light emitting bodies, new methods for improving the performance of quantum dot devices are desired.

An embodiment provides a thin film having a quantum dot device or a thin film having a multilayered structure capable of implementing high luminous efficiency.

An embodiment provides an electronic device including the quantum dot device or the thin film having the multilayered structure.

According to an embodiment, a quantum dot device includes a first electrode and a second electrode, a quantum dot layer disposed between the first electrode and the second electrode, and a hole transport layer disposed between the quantum dot layer and the first electrode, wherein the hole transport layer includes a first hole transport layer including a three-dimensional structure perovskite thin film and a second hole transport layer including a two-dimensional structure perovskite thin film.

The three-dimensional structure perovskite thin film may include a perovskite compound represented by Chemical Formula 1.

$$AMX_3 \qquad \text{Chemical Formula 1}$$

In Chemical Formula 1,

A is an ammonium cation having a C1 or C2 alkyl group, an ammonium cation having a C1 or C2 haloalkyl group, an ammonium cation having a C1 or C2 cyanoalkyl group, an ammonium cation having a C1 or C2 alkoxy group, a formamidinium cation, a halogen-substituted formamidinium cation, an alkali metal ion, or a combination thereof, M is a transition metal, a rare earth metal, or a combination thereof, and X is a halide ion, a combination of two or more different halide ions, $CNS^-$, $PF_6^-$, or $BF_4^-$.

The ammonium cation may include a cation represented by Chemical Formula 1a.

Chemical Formula 1a

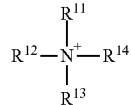

In Chemical Formula 1a, $R^{11}$, $R^{12}$, $R^{13}$, and $R^{14}$ are each independently hydrogen, a halogen, a methyl group, an ethyl group, a methoxy group, or an ethoxy group.

The two-dimensional structure perovskite thin film may include a perovskite compound represented by Chemical Formula 2.

$$AA'MX_{(4-n)}X'_n \qquad \text{Chemical Formula 2}$$

In Chemical Formula 2,

A is an ammonium cation having a C1 or C2 alkyl group, an ammonium cation having a C1 or C2 haloalkyl group, an ammonium cation having a C1 or C2 cyanoalkyl group, an ammonium cation having a C1 or C2 alkoxy group, a formamidinium cation, a halogen-substituted formamidinium cation, an alkali metal ion, or a combination thereof, A' is an organic ammonium cation, an organic amidinium cation, an organic phosphonium cation, an organic sulfonium cation, or a derivative thereof, wherein the organic ammonium cation, the organic phosphonium cation, or the organic sulfonium cation includes a substituted or unsubstituted C3 to C30 alkyl group, a substituted or unsubstituted C3 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, M is a transition metal, a rare earth metal, or a combination thereof, X is a halide ion, a combination of two or more different halide ions, $CNS^-$, $PF_6^-$, or $BF_4^-$, X' is a halide ion, and n is greater than 0 and less than 4.

The organic ammonium cation may be an amine cation. Such an amine may be a primary, secondary, or tertiary amine, an aliphatic amine, an aromatic amine, or a non-aromatic heterocyclic amine.

The organic ammonium cation may include a cation represented by Chemical Formula 2a.

Chemical Formula 2a

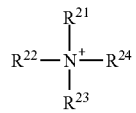

In Chemical Formula 2a, $R^{21}$, $R^{22}$, $R^{23}$, and $R^{24}$ are each independently hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, and at least one of $R^{21}$, $R^{22}$, $R^{23}$, or $R^{24}$ is a substituted or unsubstituted C3 to C30 alkyl group, a substituted or unsubstituted C3 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group.

The organic ammonium cation may include a cation represented by Chemical Formula 2aa.

Chemical Formula 2aa

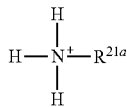

In Chemical Formula 2aa, $R^{21a}$ is a substituted or unsubstituted C3 to C30 alkyl group, a substituted or unsubstituted C3 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group.

The organic amidinium cation may include a cation represented by Chemical Formula 2b.

Chemical Formula 2b

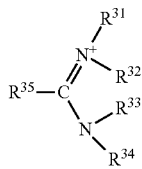

In Chemical Formula 2b, $R^{31}$ to $R^{34}$ are each independently hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, $R^{35}$ is hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, a substituted or unsubstituted C2 to C30 heteroaryl group or $NR^xR^y$, wherein $R^x$ to $R^y$ are each independently hydrogen or a substituted or unsubstituted C1 to C10 alkyl group, and at least one of $R^{31}$, $R^{32}$, $R^{33}$, $R^{34}$, or $R^{35}$ is a substituted or unsubstituted C1 to C30 alkyl group, a substituted or unsubstituted C3 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group.

The organic ammonium cation may include a cation represented by Chemical Formula 2c or Chemical Formula 2d.

Chemical Formula 2c

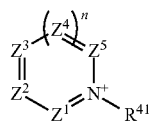

In Chemical Formula 2c, $R^{41}$ is hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, $Z^1$ to $Z^5$ are each independently $CR^a$ or N, wherein $R^a$ is hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, or adjacent $R^a$'s are linked to each other to provide a fused ring, at least one of $R^{21}$ or $R^a$ is a substituted or unsubstituted C3 to C30 alkyl group, a substituted or unsubstituted C3 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, and n is an integer of 1 to 3.

Chemical Formula 2d

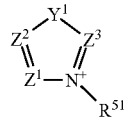

In Chemical Formula 2d, $Y^1$ is $CR^aR^b$, $NR^c$, O, S, Se, Te, or C(=O), wherein $R^a$, $R^b$, and $R^c$ are each independently hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, $R^{51}$ is hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, $Z^1$ to $Z^3$ are each independently $CR^x$ or N, wherein $R^x$ is hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, $Y^1$ is $CR^aR^b$ or $NR^c$, and when $Z^1$ to $Z^3$ are $CR^x$, two adjacent ones of $R^a$ or $R^b$, $R^c$, and $R^x$ may be linked to each other to provide a ring, and at least one of $R^{51}$, $R^a$, $R^b$, $R^c$, or $R^x$ is a substituted or unsubstituted C3 to C30 alkyl group, a substituted or unsubstituted C3 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group.

The organic ammonium cation may include a cation represented by Chemical Formula 2d.

Chemical Formula 2e

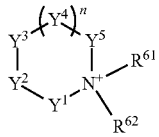

In Chemical Formula 2e, $Y^1$ to $Y^5$ are each independently $CR^aR^b$, $NR^c$, O, S, Se, Te, C=O, C=S, C=O, C=Se, or C=Te, wherein $R^a$, $R^b$, and $R^c$ are each independently hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group or two adjacent ones of $R^a$ or $R^b$ and $R^c$ may be linked to each other to provide a ring, provided that two adjacent ones of $Y^1$ to $Y^5$ are not $NR^c$, O, S, Se, Te, C=O, C=S, C=O, C=Se, or C=Te, $R^{61}$ and $R^{62}$ are each independently hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, at least one of $R^{61}$, $R^{62}$, $R^a$, $R^b$, or $R^c$ is a substituted or unsubstituted C3 to C30 alkyl group, a substituted or unsubstituted C3 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, and n is an integer of 1 to 3.

The organic ammonium cation may include a substituted or unsubstituted pyrrolidinium cation, a substituted or unsubstituted piperidinium cation, a substituted or unsubstituted pyridinium cation, a substituted or unsubstituted pyridazinium cation, a substituted or unsubstituted pyrimidinium cation, a substituted or unsubstituted pyrazinium cation, a substituted or unsubstituted imidazolium cation, a substituted or unsubstituted pyrazolium cation, a substituted or unsubstituted thiazolium cation, a substituted or unsubstituted oxazolium cation, a substituted or unsubstituted triazolium cation, a substituted or unsubstituted piperazinium cation, a substituted or unsubstituted morpholinium cation, or a combination thereof.

The organic phosphonium cation may include a cation represented by Chemical Formula 2f.

Chemical Formula 2f

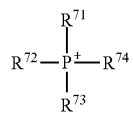

In Chemical Formula 2f, $R^{71}$, $R^{72}$, $R^{73}$, and $R^{74}$ are each independently hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, provided that at least one of $R^{71}$, $R^{72}$, $R^{73}$, or $R^{74}$ is a substituted or unsubstituted C3 to C30 alkyl group, a substituted or unsubstituted C3 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group.

The organic sulfonium cation may include a cation represented by Chemical Formula 2g.

Chemical Formula 2g

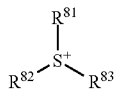

In Chemical Formula 2g, $R^{81}$, $R^{82}$, and $R^{83}$ are each independently hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, provided that at least one of $R^{81}$, $R^{82}$, or $R^{83}$ is a substituted or unsubstituted C3 to C30 alkyl group, a substituted or unsubstituted C3 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group.

The hole transport layer may have a thickness of about 10 nanometers (nm) to about 100 nm.

A ratio (T1:T2) of the thickness T1 of the first hole transport layer to the thickness T2 of the second hole transport layer may be in a range of about 1.0:1 to about 9.0:1.

The first hole transport layer may be disposed closer to the first electrode than is the second hole transport layer and the second hole transport layer may be disposed closer to the quantum dot layer than is the first hole transport layer.

An energy bandgap of the first hole transport layer may be in a range of about 2.0 electronvolts (eV) to about 2.4 eV.

An energy bandgap of the second hole transport layer may be in a range of about 2.5 eV to about 4.0 eV.

A difference between an energy bandgap of the first hole transport layer and an energy bandgap of the second hole transport layer may be in a range of about 0.1 eV to about 2.0 eV.

Each valence band of the first hole transport layer and the second hole transport layer may be present between a work function of the first electrode and a highest occupied molecular orbital (HOMO) energy level of the quantum dot layer.

A difference between a HOMO energy level of the quantum dot layer and an energy level of a valence band of the second hole transport layer may be 0 electronvolts to about 1.0 eV.

A conduction band of the second hole transport layer may have an energy level that is less than a lowest unoccupied molecular orbital (LUMO) energy level of the quantum dot layer.

A difference between an energy level of a conduction band of the second hole transport layer and a LUMO energy level of the quantum dot layer may be greater than or equal to about 0.5 eV.

The quantum dot device may further include an electron injection layer including inorganic nanoparticles or an organic material.

The inorganic nanoparticles may include metal oxide nanoparticles represented by $Zn_{1-x}Q_xO$, wherein Q is a metal other than Zn, and $0 \leq x < 0.5$.

Q may include Mg, Ce, Co, Ni, Ga, Al, Ca, Zr, W, Li, Ti, Ta, Sn, Hf, Si, Ba, or a combination thereof.

The quantum dot device may further include a hole injection layer between the first electrode and the quantum dot layer.

According to an embodiment, a method of manufacturing a quantum dot device includes coating a first composition including the perovskite compound represented by Chemical Formula 1 on the first electrode and then annealing to form a first hole transport layer; coating a second composition including the perovskite compound represented by Chemical Formula 2 on the first hole transport layer, and then annealing to form a second hole transport layer; forming a quantum dot layer on the second hole transport layer; and forming a second electrode on the quantum dot layer to manufacture the quantum dot device.

The solution may include a solvent of water, alcohol, or a combination thereof.

The annealing may be performed at a temperature of about 50° C. to about 300° C.

According to an embodiment, a thin film having a multilayered structure includes a first hole transport layer including a three-dimensional structure perovskite thin film and a second hole transport layer including a two-dimensional structure perovskite thin film.

According to an embodiment, an electronic device including the quantum dot device is provided.

By including a hole transport layer having a multilayered structure having high hole mobility and excellent electron blocking properties, a high-efficiency quantum dot device may be provided.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
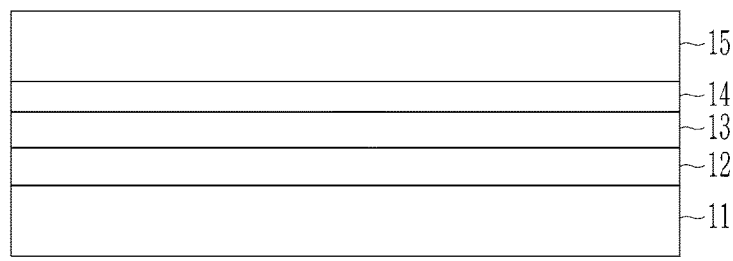
FIG. 1 is a cross-sectional view schematically showing a quantum dot device according to an embodiment.

Hereinafter, example embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third," etc. may be used herein to describe various elements, components, regions, layers, and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural unless the context clearly indicates otherwise. For example, "an element" has the same meaning as "at least one element," unless the context clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" and "upper," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, "combination" refers to a mixture or a stacked structure of two or more.

As used herein, when a definition is not otherwise provided, "substituted" refers to replacement of hydrogen of a compound or a functional group by a substituent, such as a halogen atom (F, Br, Cl, or I), a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a C1 to C20 alkyl group, a C1 to C20 alkoxy group, a C2 to C20 alkenyl group, a C2 to C20 alkynyl group, a C6 to C30 aryl group, a C7 to C30 aralkyl group, a C1 to C20 heteroalkyl group, a C3 to C20 heteroaralkyl group, a C3 to C30 cycloalkyl group, a C3 to C15 cycloalkenyl group, a C6 to C15 cycloalkynyl group, a C2 to C20 heterocycloalkyl group, or a combination thereof.

As used herein, when a definition is not otherwise provided, "hetero" refers to a compound or group one including 1 to 3 heteroatoms, such as N, O, S, P, and Si.

As used herein, "alkyl group" or "alkoxy group" may have a linear or branched structure. Examples of the alkyl group may include a methyl group, an ethyl group, a propyl group, a butyl group, a pentyl group, or a hexyl group. Examples of the alkoxy group may include a methoxy group, an ethoxy group, a propoxy group, a butoxy group, a pentoxy group, or a hexyloxy group. As used herein, an "alkenyl" group may include at least one double bond. As used herein, "alkynyl" may include at least one triple bond.

As used herein, when a definition is not otherwise provided, "aryl group" refers to a group including a, e.g., at least one, hydrocarbon aromatic moiety. All elements of the hydrocarbon aromatic moiety have p-orbitals which form conjugation, for example a phenyl group, a tolyl group, a xylyl group, a naphthyl group, and the like; two or more hydrocarbon aromatic moieties may be linked by a sigma bond and may be, for example a biphenyl group, a terphenyl group, a quaterphenyl group, and the like; or two or more hydrocarbon aromatic moieties are fused directly or indirectly to provide a non-aromatic fused ring, for example a fluorenyl group.

The aryl group may include a monocyclic, polycyclic, or fused polycyclic (i.e., rings sharing adjacent pairs of carbon atoms) functional group.

For example, the substituted or unsubstituted C6 to C30 aryl group may refer to a substituted or unsubstituted phenyl group, a substituted or unsubstituted naphthyl group, a substituted or unsubstituted anthracenyl group, a substituted or unsubstituted phenanthrenyl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted o-terphenyl group, a substituted or unsubstituted chrysenyl group, a substituted or unsubstituted triphenylene group, a substituted or unsubstituted perylenyl group, a substituted or unsubstituted fluorenyl group, a substituted or unsubstituted indenyl group, a substituted or unsubstituted furanyl group, or a combination thereof, but is not limited thereto.

For example, the substituted or unsubstituted C7 to C30 aralkyl group may include a benzyl group, a phenethyl group, and the like.

For example, the substituted or unsubstituted C2 to C30 heterocycloalkyl group, or the substituted or unsubstituted C2 to C30 heteroaryl group may refer to a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted carbazolyl group, a substituted or unsubstituted dibenzofuranyl group, or a substituted or unsubstituted dibenzothiophenyl group, or a combination thereof, but is not limited thereto.

Hereinafter, when a definition is not otherwise provided, "ring" refers to an aromatic ring, a non-aromatic ring, a heteroaromatic ring, a hetero non-aromatic ring, a fused ring thereof, or a combination thereof. The aromatic ring may be a C6 to C30 arene (i.e., aromatic ring) group, for example a C6 to C20 arene group, the non-aromatic ring may be a C3 to C30 cycloalkyl group, a C3 to C30 cycloalkenyl group or a C3 to C30 cycloalkynyl group, the heteroaromatic ring may be a C3 to C30 heteroarene group, for example a C3 to C20 heteroarene group, and the hetero non-aromatic ring may be a C3 to C30 heterocycloalkyl group, a C3 to C30 heterocycloalkenyl group, or a C3 to C30 heterocycloalkynyl group.

Hereinafter, values of a work function, a conduction band, a valence band, a HOMO energy level, or a LUMO energy level are expressed as absolute values from a vacuum level. In addition, when the work function, conduction band, valence band, HOMO energy level, or LUMO energy level is referred to be, e.g., as, deep, high, or large the work function, conduction band, valence band, HOMO energy level, or LUMO energy level may have a large absolute value based on "0 eV" of the vacuum level, and when the work function, conduction band, valence band, HOMO energy level, or LUMO energy level is referred to be, e.g., as, shallow, low, or small, the work function, conduction band, valence band, HOMO energy level, or LUMO energy level may have a small absolute value based on "0 eV" of the vacuum level.

Hereinafter, the conduction band minimum (CBM) of the perovskite compound refers to the lowest end, e.g., energy level, of the conduction band, and the valence band maximum (VBM) of the perovskite compound refers to the uppermost end, e.g., energy level, of the valence band. A difference between the CBM and the VBM is referred to be, e.g., as, a bandgap or energy bandgap.

The HOMO energy level and valence band are obtained using AC-3 equipment (Riken Keiki Co. Ltd.) by measuring a photoelectric work function of a thin film having a thickness of about 20 nm to about 30 nm, and calculating the emission energy due to the photoelectron effect for the irradiated energy by the following relationship equation in the range of about 7.0 eV to about 4.0 eV.

$$E = h \cdot c / \lambda \quad \text{Relationship Equation}$$

(h: plank's constant, c: light velocity, and $\lambda$: wavelength)

LUMO energy level and conduction band obtained by taking ultraviolet (UV) absorption with an ultraviolet-visible (UV-Vis) spectrophotometer using an AC-3 equipment (Riken Keiki Co. Ltd.), converting the edge wavelength at which absorption occurs to eV units to obtain an optical bandgap, and adding the obtained bandgap to the HOMO energy level and valence band.

Hereinafter, a quantum dot device according to an embodiment will be described with reference to the drawings.

FIG. 1 is a cross-sectional view schematically illustrating a quantum dot device according to an embodiment.

Referring to FIG. 1, a quantum dot device 10 according to an embodiment includes a first electrode 11 and a second electrode 15 facing each other; a quantum dot layer 14 disposed between the first electrode 11 and the second electrode 15, and a first hole transport layer 12 and a second hole transport layer 13 disposed between the first electrode 11 and the quantum dot layer 14.

A substrate (not shown) may be disposed at the side of the first electrode 11 or at the side of the second electrode 15. The substrate may include, for example, an inorganic material such as glass; an organic material such as polycarbonate, polymethyl methacrylate, polyethylene terephthalate, polyethylene naphthalate, polyamide, polyethersulfone, or a combination thereof; or the substrate may be made of a silicon wafer or the like. The substrate may be omitted.

One of the first electrode 11 and the second electrode 15 is an anode and the other is a cathode. For example, the first electrode 11 may be an anode and the second electrode 15 may be a cathode. For example, the first electrode 11 may be a cathode and the second electrode 15 may be an anode.

The anode may include a conductor having a high work function, for example, a metal, a conductive metal oxide, or a combination thereof. The anode may include, for example, a metal such as nickel, platinum, vanadium, chromium, copper, zinc, gold, or an alloy thereof; a conductive metal oxide such as zinc oxide, indium oxide, tin oxide, indium tin oxide (ITO), indium zinc oxide (IZO), or fluorine-doped tin oxide; or a combination of a metal such as ZnO and Al or SnO$_2$ and Sb and an oxide, but is not limited thereto.

The cathode may include a conductor having a lower, e.g., smaller, work function than the anode, and may include, for example, a metal, a conductive metal oxide, a conductive polymer, or a combination thereof. The cathode may include, for example, a metal such as aluminum, magnesium, calcium, sodium, potassium, titanium, indium, yttrium, lithium, gadolinium silver, tin, lead, cesium, barium, and the like, or an alloy thereof; a multilayered structure material such as LiF/Al, LiO$_2$/Al, Liq/Al, LiF/Ca, and BaF$_2$/Ca, but is not limited thereto.

A work function of the anode may be higher than a work function of the cathode, for example the work function of the anode may be, for example, about 4.5 eV to about 5.0 eV and the work function of the cathode may be about 4.0 eV to about 4.7 eV. Within this range, the work function of the anode may be, for example, about 4.6 eV to about 4.9 eV or about 4.6 eV to about 4.8 eV, and the work function of the cathode may be, for example, about 4.0 eV to about 4.6 eV or about 4.3 eV to about 4.6 eV.

The first electrode 11, the second electrode 15, or a combination thereof may be a light-transmitting electrode and the light-transmitting electrode may be for example made of a conductive oxide such as a zinc oxide, indium oxide, tin oxide, indium tin oxide (ITO), indium zinc oxide (IZO), or fluorine doped tin oxide, or a single- or multi-layer thin metal layer. When one of the first electrode 11 and the second electrode 15 is a non-light-transmitting electrode, the non-light-transmitting electrode may be made of for example an opaque conductor such as aluminum (Al), silver (Ag), or gold (Au).

The quantum dot layer 14 includes quantum dots. The quantum dot may be a semiconductor nanocrystal in a general concept, and may have various shapes, for example an isotropic semiconductor nanocrystal, a quantum rod, and a quantum plate. Herein, the quantum rod may indicate a quantum dot having an aspect ratio of greater than about 1, for example, greater than or equal to about 2, greater than or equal to about 3, or greater than or equal to about 5. For example, the quantum rod may have an aspect ratio of less than or equal to about 50, less than or equal to about 40, less than or equal to about 30, or less than or equal to about 20.

The quantum dot may have for example a particle diameter (an average largest particle diameter for a non-spherical shape) of for example about 1 nm to about 100 nm, about 1 nm to about 80 nm, about 1 nm to about 50 nm, or about 1 nm to 20 nm.

Energy bandgaps of quantum dots may be controlled according to sizes and compositions of the quantum dots, and thus light emitting wavelength may be controlled. For example, as the sizes of quantum dots increase, the quantum dots may have narrow energy bandgaps and thus emits light in a relatively long wavelength region while as the sizes of the quantum dots decrease, the quantum dots may have wide energy bandgap and thus emits light in a relatively short wavelength region.

For example, the quantum dot may emit for example light in a predetermined wavelength region of a visible ray region according to a size of the quantum dot, a composition of the quantum dot, or a combination thereof. For example, the quantum dot may emit blue light, red light, or green light, and the blue light may have for example a peak emission wavelength ($\lambda_{max}$) in about 430 nm to about 480 nm, the red light may have for example a peak emission wavelength ($\lambda_{max}$) in about 600 nm to about 650 nm, and the green light may have for example a peak emission wavelength ($\lambda_{max}$) in about 520 nm to about 560 nm.

For example, an average size of the quantum dot emitting blue light may be, for example, less than or equal to about 4.5 nm, and for example, less than or equal to about 4.3 nm, less than or equal to about 4.2 nm, less than or equal to about 4.1 nm, or less than or equal to about 4.0 nm. Within the range, for example, an average size of the quantum dot may be about 2.0 nm to about 4.5 nm, for example, about 2.0 nm to about 4.3 nm, about 2.0 nm to about 4.2 nm, about 2.0 nm to about 4.1 nm, or about 2.0 nm to about 4.0 nm.

The quantum dot may have for example a quantum yield of greater than or equal to about 10%, greater than or equal to about 20%, greater than or equal to about 30%, greater than or equal to about 50%, greater than or equal to about 60%, greater than or equal to about 70% or greater than or equal to about 90%.

The quantum dot may have a relatively narrow full width at half maximum (FWHM). Herein, the FWHM is a width of a wavelength corresponding to a half of a peak absorption point and as the FWHM is narrower, e.g., decreased, light in a narrower wavelength region may be emitted and high color purity may be obtained.

The quantum dot may have for example a FWHM of less than or equal to about 50 nm, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm. Within the range, the quantum dot may have for example a FWHM of about 2 nm to about 49 nm, about 2 nm to about 48 nm, about 2 nm to about 47 nm, about 2 nm to about 46 nm, about 2 nm to about 45 nm, about 2 nm to about 44 nm, about 2 nm to about 43 nm, about 2 nm to about 42 nm, about 2 nm to about 41 nm, about 2 nm to about 40 nm, about 2 nm to about 39 nm, about 2 nm to about 38 nm, about 2 nm to about 37 nm, about 2 nm to about 36 nm, about 2 nm to about 35 nm, about 2 nm to about 34 nm, about 2 nm to about 33 nm, about 2 nm to about 32 nm, about 2 nm to about 31 nm, about 2 nm to about 30 nm, about 2 nm to about 29 nm, or about 2 nm to about 28 nm.

For example, the quantum dot may include a Group II-VI semiconductor compound, a Group III-V semiconductor compound, a Group IV-VI semiconductor compound, a Group IV semiconductor compound, a Group semiconductor compound, a Group I-II-IV-VI semiconductor compound, a Group II-III-V semiconductor compound, or a combination thereof. The Group II-VI semiconductor compound may be for example a binary element compound such as CdSe, CdTe, ZnS, ZnSe, ZnTe, ZnO, HgS, HgSe, HgTe, MgSe, MgS, or a combination thereof; a ternary element compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; a quaternary element compound such as HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof; or a combination thereof, but is not limited thereto. The Group III-V semiconductor compound may be for example a binary element compound such as GaN, GaP, GaAs, GaSb, AlN, AlP, AlAs, AlSb, InN, InP, InAs, InSb, or a combination thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; a quaternary element compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof; or a combination thereof, but is not limited thereto. The Group IV-VI semiconductor compound may be for example a binary element compound such as SnS, SnSe, SnTe, PbS, PbSe, PbTe, or a combination thereof; a ternary element compound such as SnSeS, SnSeTe, SnSTe, PbSeS, PbSeTe, PbSTe, SnPbS, SnPbSe, SnPbTe, or a combination thereof; a quaternary element compound such as SnPbSSe, SnPbSeTe, SnPbSTe, or a combination thereof; or a combination thereof, but is not limited thereto. The Group IV semiconductor compound may be for example a single element semiconductor compound such as Si, Ge, or a combination thereof; a binary element semiconductor compound such as SiC, SiGe, or a combination thereof; or a combination thereof, but is not limited thereto. The Group semiconductor compound may be for example CuInSe$_2$, CuInS$_2$, CuInGaSe, CuInGaS, or a combination thereof, but is not limited thereto. The Group I-II-IV-VI semiconductor compound may be for example CuZnSnSe, CuZnSnS, or a combination thereof, but is not limited thereto. The Group II-III-V semiconductor compound may include for example InZnP, but is not limited thereto.

The quantum dot may include the binary semiconductor compound, the ternary semiconductor compound, or the quaternary semiconductor compound in a substantially uniform concentration or partially different concentration distributions.

For example, the quantum dot may include a cadmium (Cd)-free quantum dot. The cadmium-free quantum dot is a quantum dot that does not include cadmium (Cd). Cadmium (Cd) may cause severe environment/health problems and a restricted element by Restriction of Hazardous Substances Directive (RoHS) in a plurality of countries, and thus the cadmium-free quantum dot may be effectively used.

As an example, the quantum dot may be a semiconductor compound including zinc (Zn), and tellurium (Te) or selenium (Se). For example, the quantum dot may be a Zn—Te semiconductor compound, a Zn—Se semiconductor compound, a Zn—Te—Se semiconductor compound, or a combination thereof. For example, an amount of tellurium (Te) in the Zn—Te—Se semiconductor compound may be less than an amount of selenium (Se). The semiconductor compound may have a peak emission wavelength ($\lambda_{max}$) in a wavelength region of less than or equal to about 480 nm, for example, about 430 nm to about 480 nm, and may emit blue light.

For example, the quantum dot may be a semiconductor compound including indium (In) and zinc (Zn), phosphorus (P), or a combination thereof. For example, the quantum dot may be an In—P semiconductor compound, an In—Zn—P semiconductor compound, or a combination thereof. For example, in the In—Zn—P semiconductor compound, a mole ratio of zinc (Zn) to indium (In) may be greater than or equal to about 25:1. The semiconductor compound may have a peak emission wavelength ($\lambda_{max}$) in a wavelength region of less than about 700 nm, for example about 600 nm to about 650 nm, and may emit red light.

The quantum dot may have a core-shell structure wherein one quantum dot surrounds another quantum dot. For example, the core and the shell of the quantum dot may have an interface, and an element of the core in the interface, the shell in the interface, or a combination thereof may have a concentration gradient wherein the concentration of the element(s) of the shell decreases (in a direction) toward the core. For example, a material composition of the shell of the quantum dot has a higher energy bandgap than a material composition of the core of the quantum dot, and thereby the quantum dot may exhibit a quantum confinement effect.

The quantum dot may have one quantum dot core and a multi-layered quantum dot shell surrounding the core. Herein, the multilayered shell has at least two shells wherein each shell may be a single composition, be an alloy, have a concentration gradient, or a combination thereof.

For example, a shell of a multilayered shell that is far from the core may have a higher energy bandgap than a shell that is near to the core, and thereby the quantum dot may exhibit a quantum confinement effect.

For example, the quantum dot having a core-shell structure may for example include a core including a first semiconductor compound including zinc (Zn) and tellurium (Te), selenium (Se), or a combination thereof and a shell including a second semiconductor compound disposed on at least a portion of the core and having a different composition from that of the core.

For example, the first semiconductor compound may be a Zn—Te—Se-based semiconductor compound including zinc (Zn), tellurium (Te), and selenium (Se), for example, a Zn—Se-based semiconductor compound including a small amount of tellurium (Te), for example, a semiconductor compound represented by ZnTe$_x$Se$_{1-x}$, where x is greater than about 0 and less than or equal to 0.05.

For example, in the Zn—Te—Se-based first semiconductor compound, a mole amount of zinc (Zn) may be higher than that of selenium (Se), and a mole amount of selenium (Se) may be higher than that of tellurium (Te). For example, in the first semiconductor compound, a mole ratio of tellurium (Te) to selenium (Se) may be less than or equal to about 0.05:1, less than or equal to about 0.049:1, less than or equal to about 0.048:1, less than or equal to about 0.047:1, less than or equal to about 0.045:1, less than or equal to about 0.044:1, less than or equal to about 0.043:1, less than or equal to about 0.042:1, less than or equal to about 0.041:1, less than or equal to about 0.04:1, less than or equal to about 0.039:1, less than or equal to about 0.035:1, less than or equal to about 0.03:1, less than or equal to about 0.029:1, less than or equal to about 0.025:1, less than or equal to about 0.024:1, less than or equal to about 0.023:1, less than or equal to about 0.022:1, less than or equal to about 0.021:1, less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, or less than or equal to about 0.01:1. For example, in the first semiconductor compound, a mole ratio of tellurium (Te) to zinc (Zn) may be less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, or less than or equal to about 0.01:1.

The second semiconductor compound may include, for example, a Group II-VI semiconductor compound, a Group III-V semiconductor compound, a Group IV-VI semiconductor compound, a Group IV semiconductor compound, a Group semiconductor compound, a Group I-II-IV-VI semiconductor compound, a Group II-III-V semiconductor compound, or a combination thereof. Examples of the Group II-VI semiconductor compound, Group III-V semiconductor compound, Group IV-VI semiconductor compound, Group IV semiconductor compound, Group semiconductor compound, Group I-II-IV-VI semiconductor compound, and Group II-III-V semiconductor compound are the same as described herein.

For example, the second semiconductor compound may include zinc (Zn), selenium (Se), sulfur (S), or a combination thereof. For example, the shell may include ZnSeS, ZnSe, ZnS, or a combination thereof. For example, the shell may include a, e.g., at least one, inner shell disposed close to, e.g., directly on, the core and an outermost shell disposed at the outermost side of the quantum dot. The inner shell may include ZnSeS, ZnSe, or a combination thereof and the outermost shell may include ZnS. For example, the shell may have a concentration gradient of one component and for example an amount of sulfur (S) may increase as being apart, e.g., in a direction away, from the core.

For example, a quantum dot having a core-shell structure may include a core including a third semiconductor compound including indium (In) and zinc (Zn), phosphorus (P), or a combination thereof and a shell disposed on at least a portion of the core and including a fourth semiconductor compound having a composition different from the core.

In the In—Zn—P-based third semiconductor compound, a mole ratio of zinc (Zn) to indium (In) may be greater than or equal to about 25:1. For example, in the In—Zn—P-based first semiconductor compound, the mole ratio of zinc (Zn) to indium (In) may be greater than or equal to about 28:1, greater than or equal to about 29:1, or greater than or equal to about 30:1. For example, in the In—Zn—P-based first semiconductor compound, the mole ratio of zinc (Zn) to indium (In) may be less than or equal to about 55:1, for example less than or equal to about 50:1, less than or equal to about 45:1, less than or equal to about 40:1, less than or equal to about 35:1, less than or equal to about 34:1, less than or equal to about 33:1, or less than or equal to about 32:1.

The fourth semiconductor compound may include, for example, a Group II-VI semiconductor compound, a Group III-V semiconductor compound, a Group IV-VI semiconductor compound, a Group IV semiconductor compound, a Group semiconductor compound, a Group I-II-IV-VI semiconductor compound, a Group II-III-V semiconductor compound, or a combination thereof. Examples of the Group II-VI semiconductor compound, Group III-V semiconductor compound, Group IV-VI semiconductor compound, Group IV semiconductor compound, Group semiconductor compound, Group I-II-IV-VI semiconductor compound, and Group II-III-V semiconductor compound are the same as described herein.

For example, the fourth semiconductor compound may include zinc (Zn) and sulfur (S) and optionally selenium (Se). For example, the shell may include ZnSeS, ZnSe, ZnS, or a combination thereof. For example, the shell may include a, e.g., at least one, inner shell disposed close to, e.g., directly on, the core and an outermost shell disposed at the outermost side of the quantum dot. The inner shell, the outermost shell, or a combination thereof may include a fourth semiconductor compound of ZnS, ZnSe, or ZnSeS.

The quantum dot layer 14 may have a thickness of, for example, about 5 nm to about 200 nm, within the range, for example, about 10 nm to about 150 nm, for example about 10 nm to about 100 nm, for example about 10 nm to about 50 nm.

The quantum dot layer 14 may have a relatively deep, e.g., large, HOMO energy level, for example, a HOMO energy level of greater than or equal to about 5.4 eV, within the range, for example greater than or equal to about 5.5 eV, for example greater than or equal to about 5.6 eV, for example greater than or equal to about 5.7 eV, for example about greater than or equal to about 5.8 eV, for example greater than or equal to about 5.9 eV, for example greater than or equal to about 6.0 eV. Within the range, the HOMO energy level of the quantum dot layer 14 may be for example about 5.4 eV to about 7.0 eV, for example about 5.4 eV to about 6.8 eV, for example, about 5.4 eV to about 6.7 eV, for example, about 5.4 eV to about 6.5 eV, for example, about 5.4 eV to about 6.3 eV, for example, about 5.4 eV to about 6.2 eV, for example, about 5.4 eV to about 6.1 eV, within the range, for example, about 5.5 eV to about 7.0 eV, for example, about 5.5 eV to about 6.8 eV, for example, about 5.5 eV to about 6.7 eV, for example, about 5.5 eV to about 6.5 eV, for example, about 5.5 eV to about 6.3 eV, for example, about 5.5 eV to about 6.2 eV, for example, about 5.5 eV to about 6.1 eV, for example, about 5.5 eV to about 7.0 eV, for example, about 5.6 eV to about 6.8 eV, for example, about 5.6 eV to about 6.7 eV, for example, about 5.6 eV to about 6.5 eV, for example, about 5.6 eV to about 6.3 eV, for example, about 5.6 eV to about 6.2 eV, for example, about 5.6 eV to about 6.1 eV, within the range, for example, about 5.7 eV to about 7.0 eV, for example, about 5.7 eV to about 6.8 eV, for example, about 5.7 eV to about 6.7 eV, for example, about 5.7 eV to about 6.5 eV, for example, about 5.7 eV to about 6.3 eV, for example, about 5.7 eV to about 6.2 eV, for example, about 5.7 eV to about 6.1 eV, within the range, for example, about 5.8 eV to about 7.0 eV, for example, about 5.8 eV to about 6.8 eV, for example, about 5.8 eV to about 6.7 eV, for example, about 5.8 eV to about 6.5 eV, for example, about 5.8 eV to about 6.3 eV, for example, about 5.8 eV to about 6.2 eV, for example, about 5.8 eV to about 6.1 eV, within the range, for example, about 6.0 eV to about 7.0 eV, for example, about 6.0 eV to about 6.8 eV, for example, about 6.0 eV to about 6.7 eV, for example, about 6.0 eV to about 6.5 eV, for example, about 6.0 eV to about 6.3 eV, for example, about 6.0 eV to about 6.2 eV.

The quantum dot layer 14 may have a relatively shallow, e.g., low, LUMO energy level, for example, less than or equal to about 3.6 eV, within the range, for example, less than or equal to about 3.7 eV, for example, less than or equal to about 3.6 eV, for example, less than or equal to about 3.5 eV, for example, less than or equal to about 3.4 eV, for example less than or equal to about 3.3 eV, for example, less than or equal to about 3.2 eV, for example, less than or equal to about 3.0 eV. Within the range, the LUMO energy level of the quantum dot layer 14 may be about 2.5 eV to about 3.7 eV, about 2.5 eV to about 3.6 eV, about 2.5 eV to about 3.5 eV, about 2.5 eV to about 3.4 eV, about 2.5 eV to about 3.3 eV, about 2.5 eV to about 3.2 eV, about 2.5 eV to about 3.1 eV, about 2.5 eV to about 3.0 eV, about 2.8 eV to about 3.7 eV, about 2.8 eV to about 3.6 eV, about 2.8 eV to about 3.5 eV, about 2.8 eV to about 3.4 eV, about 2.8 eV to about 3.3 eV, about 2.8 eV to about 3.2 eV, about 2.5 eV to about 3.7 eV, about 3.0 eV to about 3.6 eV, about 3.0 eV to about 3.5 eV, or about 3.0 eV to about 3.4 eV.

The quantum dot layer 14 may have an energy bandgap of about 1.7 eV to about 2.3 eV or about 2.4 eV to about 2.9 eV. Within the range, for example, the quantum dot layer 14 may have an energy bandgap of about 1.8 eV to about 2.2 eV or about 2.4 eV to about 2.8 eV, within the range, for example, about 1.9 eV to about 2.1 eV, for example, about 2.4 eV to about 2.78 eV.

The first hole transport layer 12 and the second hole transport layer 13 are disposed between the first electrode 11 and the quantum dot layer 14. The first hole transport layer 12 having excellent hole transport property may be disposed closer to the first electrode 11 than is the second hole transport layer 13 (e.g., the first hole transport layer 12 may be disposed adjacent the first electrode 11) and between the first electrode 11 and the quantum dot layer 14, and the second hole transport layer 13 having excellent electron blocking property may be disposed closer to the quantum dot layer 14 than is the first hole transport layer 12 (e.g., the second hole transport layer 13 may be disposed adjacent the quantum dot layer 14) and between the first electrode 11 and the quantum dot layer 14. Thereby, a recombination rate of holes and electrons are increased to provide a quantum dot device with high efficiency.

The first hole transport layer 12 may include a three-dimensional structure perovskite thin film having a high mobility so as to effectively transfer the holes injected from the first electrode 11 to the quantum dot layer 14, and the second hole transport layer 13 may include a two-dimensional structure perovskite thin film having excellent electron blocking properties. Accordingly, the first hole transport layer 12 and the second hole transport layer 13 may be a hole transport layer having a multilayered structure having excellent hole transport properties and excellent electron blocking properties. The first hole transport layer 12 and the second hole transport layer 13 may have a structure of two or more layers.

The three-dimensional structure perovskite thin film may include a perovskite compound represented by Chemical Formula 1.

$$AMX_3 \qquad \text{Chemical Formula 1}$$

In Chemical Formula 1,

A is an ammonium cation having a C1 to C3 alkyl group, an ammonium cation having a C1 to C3 haloalkyl group, an ammonium cation having a C1 to C3 cyanoalkyl group, an ammonium cation having a C1 to C3 alkoxy group, a formamidinium cation, a halogen-substituted formamidinium cation, an alkali metal ion, or a combination thereof, M is a transition metal, a rare earth metal, or a combination thereof, and X is a halide ion, a combination of two or more different halide ions, CNS$^-$, PF$_6^-$, or BF$_4^-$.

The alkali metal of the alkali metal ion may include Na, Rb, Cs, or a combination thereof, and the halide ion may be, for example, Cl$^-$, Br$^-$, I$^-$, or a combination thereof.

M may be Pb, Sn, Mn, Cu, Ga, Ge, In, Al, Sb, Bi, Po, Eu, Yb, Ni, Co, Fe, Cr, Pd, Cd, Ca, Sr, or a combination thereof.

The halide ion may be represented by $X^1_x X^2_y X^3_{(3-x-y)}$ wherein, $X^1$, $X^2$, and $X^3$ are Cl$^-$, Br$^-$, or I$^-$, respectively, 0≤x≤3, 0≤y≤3, and x+y<3.

The ammonium cation may include a cation represented by Chemical Formula 1a.

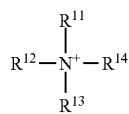

Chemical Formula 1a

In Chemical Formula 1a, $R^{11}$, $R^{12}$, $R^{13}$, and $R^{14}$ are each independently hydrogen, a halogen, a methyl group, an ethyl group, a methoxy group, or an ethoxy group.

The two-dimensional structure perovskite thin film may include a perovskite compound represented by Chemical Formula 2.

$$AA'MX_{(4-n)}X'_n \qquad \text{Chemical Formula 2}$$

In Chemical Formula 2,

A is an organic cation, an alkali metal ion, or a combination thereof,

A' is an organic ammonium cation, an organic amidinium cation, an organic phosphonium cation, an organic sulfonium cation, or a derivative thereof, wherein the organic ammonium cation, the organic phosphonium cation, or the organic sulfonium cation include a substituted or unsubstituted C3 to C30 (linear or branched) alkyl group, a substituted or unsubstituted C3 to C30 (linear or branched) alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, M is a transition metal, a rare earth metal, or a combination thereof, X is a halide ion, a combination of two or more different halide ions, CNS$^-$, PF$_6^-$, or BF$_4^-$, X' is a halide ion, and n is greater than 0 and less than 4.

In Chemical Formula 1, the alkali metal ion (A) may include, for example Na, Rb, Cs or a combination thereof and the halide ion may include, for example Cl$^-$, Br$^-$, I$^-$, or a combination thereof.

In Chemical Formula 1 and Chemical Formula 2, M may be Pb, Sn, Mn, Cu, Ga, Ge, In, Al, Sb, Bi, Po, Eu, Yb, Ni, Co, Fe, Cr, Pd, Cd, Ca, Sr, or a combination thereof.

In Chemical Formula 1 and Chemical Formula 2, the halide ion (X) may be represented by $X^1_x X^2_y X^3_{(3-x-y)}$, wherein $X^1$, $X^2$, and $X^3$ are each Cl$^-$, Br$^-$, or I$^-$, 0≤x≤3, 0≤y≤3, and x+y<3.

The organic ammonium cation (A') may be an amine cation. Such an amine may be a primary, secondary, or tertiary amine, and may be an aliphatic amine, an aromatic amine, or a non-aromatic heterocyclic amine. Examples of the aliphatic amine may include isopropyl amine, butyl amine, ethylpropyl amine, monopropanol amine, dipropanol amine, tripropanol amine, butylene diamine, N,N-diisopropyl ethyl amine, hexamethylene diamine, and the like; examples of the aromatic amine may include aniline, and examples of the non-aromatic heterocyclic amine may include pyrrolidine, piperidine, piperazine, morpholine, pyridine, pyridazine, pyrimidine, pyrazine, oxazole, and thiazole.

The organic ammonium cation may include a cation represented by Chemical Formula 2a.

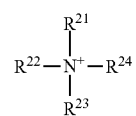

Chemical Formula 2a

In Chemical Formula 2a, $R^{21}$, $R^{22}$, $R^{23}$, and $R^{24}$ are each independently hydrogen, a substituted or unsubstituted (linear or branched) C1 to C30 alkyl group, a substituted or unsubstituted (linear or branched) C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, and at least one of $R^{21}$, $R^{22}$, $R^{23}$, or $R^{24}$ is a substituted or unsubstituted (linear or branched) C3 to C30 alkyl group, a substituted or unsubstituted (linear or branched) C3 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group.

The organic ammonium cation may include a cation represented by Chemical Formula 2aa.

Chemical Formula 2aa

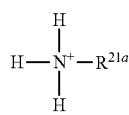

In Chemical Formula 2aa, $R^{21a}$ is a substituted or unsubstituted (linear or branched) C3 to C30 alkyl group, a substituted or unsubstituted (linear or branched) C3 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group.

Specific examples of the organic ammonium cation represented by Chemical Formula 2aa may include cations represented by Chemical Formulas 2aa-1 to 2aa-3.

Chemical Formula 2aa-1

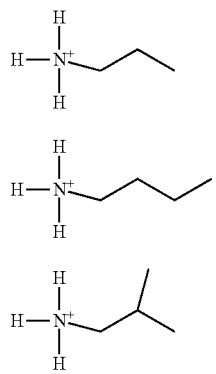

(1)

(2)

(3)

(4)

(5)

(6)

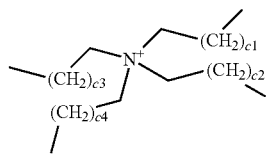

In Chemical Formula 2aa-1, hydrogen in Chemical Formulas (1) to (6) may be replaced by a halogen (F, Cl, Br, or I) or a C1 to C10 alkyl group, a non-adjacent $CH_2$ of the alkylene chains of Chemical Formulas (1) to (3) may be replaced by O, S, C(=O), C(=O)O, or OC(=O), in Chemical Formula (5), $Y^1$ is O, S, C(=O), C(=O)O, or OC(=O), and a is an integer from 1 to 5, and in Chemical Formula (6), c1 to c4 are each independently an integer of 1 to 10, and a non-adjacent $CH_2$ may be replaced by O, S, C(=O), C(=O)O, or OC(=O).

When hydrogen is replaced by a halogen (F) in Chemical Formulas (1) to (6) of Chemical Formula 2aa-1, a fluoroalkyl group or a perfluoroalkyl group may be provided.

Chemical Formula 2aa-2

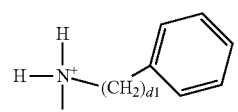

(7)

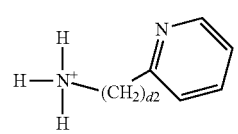

(8)

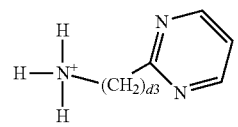

(9)

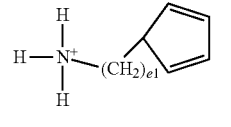

(10)

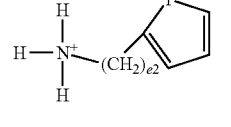

(11)

In Chemical Formula 2aa-2, hydrogen of Chemical Formulas (7) to (11) may be replaced by a halogen (F, Cl, Br, or I) or a C1 to C10 alkyl group, in Chemical Formula (11), $Y^2$ is O, S, C(=O), C(=O)O, or OC(=O) and a is an integer of 1 to 5, and in Chemical Formulas (7) to (11), d1, d2, d3, e1, and e2 are each independently an integer of 1 to 10 and a non-adjacent $CH_2$ may be replaced by O, S, C(=O), C(=O)O, or OC(=O).

Chemical Formula 2aa-3

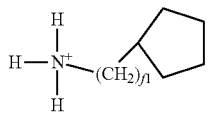
(12)

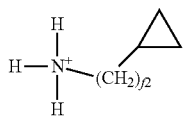
(13)

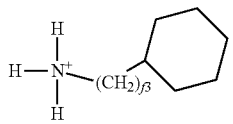
(14)

In Chemical Formula 2aa-3,
hydrogen in Chemical Formulas (12) to (14) may be replaced by a halogen (F, Cl, Br, or I) or a C1 to C10 alkyl group, and
in Chemical Formulas (12) to (14), f1, f2, and f3 are each independently an integer of 1 to 10 and a non-adjacent $CH_2$ may be replaced by O, S, C(=O), C(=O)O, or OC(=O). Herein, when f1, f2 and f3 are integers of 2 or more, the $CH_2$ may be a $CH_2$ of $(CH_2)_{f1}$, $(CH_2)_{f2}$, or $(CH_2)_{f3}$; or a $CH_2$ present inside the ring of cycloalkyl.

The organic amidinium cation may include a cation represented by Chemical Formula 2b.

Chemical Formula 2b

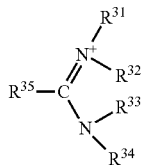

In Chemical Formula 2b,
$R^{31}$ to $R^{34}$ are each independently hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group,
$R^{35}$ is hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, a substituted or unsubstituted C2 to C30 heteroaryl group or $NR^xR^y$, wherein $R^x$ to $R^y$ are each independently hydrogen or a substituted or unsubstituted C1 to C10 alkyl group, and
at least one of $R^{31}$, $R^{32}$, $R^{33}$, $R^{34}$, or $R^{35}$ is a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group.

The organic amidinium cation may include a cation represented by Chemical Formula 2ba.

Chemical Formula 2ba

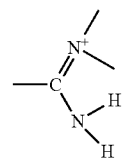
(1)

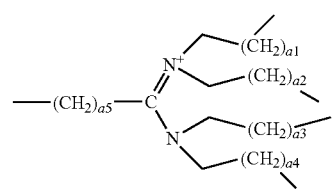
(2)

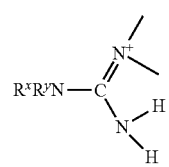
(3)

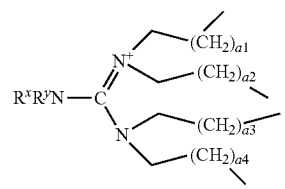
(4)

In Chemical Formula 2ba,
hydrogen in Chemical Formulas (1) to (4) may be replaced by a halogen (F, Cl, Br, or I) or a C1 to C10 alkyl group, and
a non-adjacent $CH_2$ of the alkylene chains of Chemical Formulas (2) and (4) may be replaced by O, S, C(=O), C(=O)O, or OC(=O),
in Chemical Formulas (2) and (4), a1 to a4 are each independently an integer of 1 to 10, and
in Chemical Formula (3) and (4), $R^x$ and $R^y$ are each independently hydrogen or a C1 to C10 alkyl group.

The organic ammonium cation may include a cation represented by Chemical Formula 2c.

Chemical Formula 2c

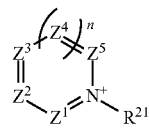

In Chemical Formula 2c,
$R^{21}$ is hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, $Z^1$ to $Z^5$ are each independently $CR^a$ or N, wherein $R^a$ is hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, or adjacent $R^a$'s are linked to each other to provide a fused ring, and n is an integer of 1 to 3.

In Chemical Formula 2c, at least one of $R^{21}$ or $R^a$ may be a substituted or unsubstituted C3 to C30 alkyl group, a substituted or unsubstituted C3 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group.

The organic ammonium cation may include a cation represented by Chemical Formula 2ca.

Chemical Formula 2ca

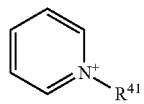 (1)

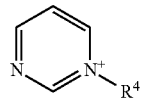 (2)

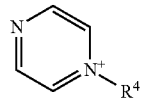 (3)

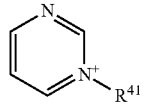 (4)

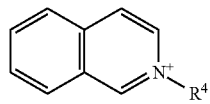 (5)

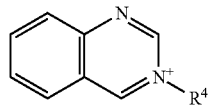 (6)

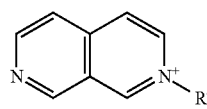 (7)

In Chemical Formula 2ca, $R^{41}$ is hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, and hydrogen of the aromatic ring may be replaced by a halogen (F, Cl, Br, or I) or a C1 to C10 alkyl group.

In Chemical Formula 2ca, CH of the aromatic ring may be replaced by N.

The organic ammonium cation may include a cation represented by Chemical Formula 2d.

Chemical Formula 2d

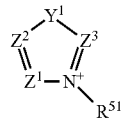

In Chemical Formula 2d, $Y^1$ is $CR^aR^b$, $NR^c$, O, S, Se, Te, or C(=O), wherein $R^a$, $R^b$, and $R^c$ are each independently hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, $R^{51}$ is hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, $Z^1$ to $Z^3$ are each independently $CR^x$ or N, wherein $R^x$ is hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, and $Y^1$ is $CR^aR^b$ or $NR^c$, and when $Z^1$ to $Z^3$ are $CR^x$, two adjacent ones of $R^a$ or $R^b$, $R^c$, and $R^x$ may be linked to each other to provide a ring.

In Chemical Formula 2d, at least one of $R^{51}$, $R^a$, $R^b$, $R^c$, or $R^x$ may be a substituted or unsubstituted C3 to C30 alkyl group, a substituted or unsubstituted C3 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group.

The organic ammonium cation may include a cation represented by Chemical Formula 2da.

Chemical Formula 2da

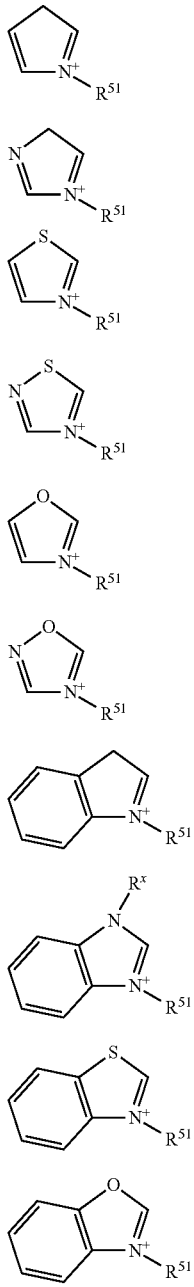

(1)
(2)
(3)
(4)
(5)
(6)
(7)
(8)
(9)

In Chemical Formula 2da,
$R^{51}$ may be hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group,
$R^x$ may be hydrogen or a substituted or unsubstituted C1 to 010 alkyl group, and
hydrogen of the aromatic ring may be replaced by a halogen (F, Cl, Br, or I) or a C1 to 010 alkyl group.

The organic ammonium cation may include a cation represented by Chemical Formula 2e.

Chemical Formula 2e

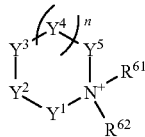

In Chemical Formula 2e,
$Y^1$ to $Y^5$ are each independently $CR^aR^b$, $NR^c$, O, S, Se, Te, C=O, C=S, C=O, C=Se, or C=Te, wherein $R^a$, $R^b$, and $R^c$ are each independently hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group or two adjacent ones of $R^a$ or $R^b$ and $R^c$ may be linked to each other to provide a ring, provided that two adjacent ones of $Y^1$ to $Y^5$ are not $NR^c$, O, S, Se, Te, C=O, C=S, C=O, C=Se, or C=Te,
$R^{61}$ and $R^{62}$ are each independently hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, and
n is an integer of 1 to 3.

In Chemical Formula 2e, at least one of $R^{61}$, $R^{62}$, $R^a$, $R^b$, or $R^c$ may be a substituted or unsubstituted C3 to C30 alkyl group, a substituted or unsubstituted C3 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group.

The organic ammonium cation may include a cation represented by Chemical Formula 2ea.

Chemical Formula 2ea

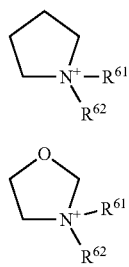

(1)

(2)

-continued (3) 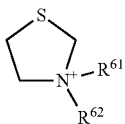

(4) 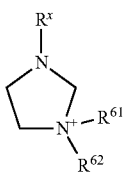

(5) 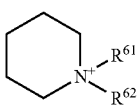

(6) 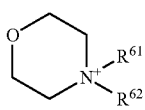

(7) 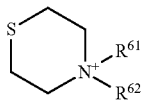

(8) 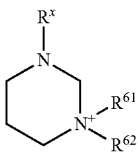

(9) 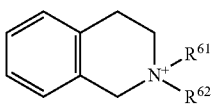

(10) 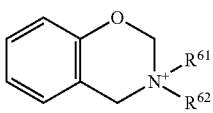

(11) 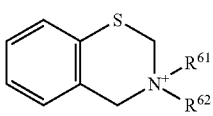

(12) 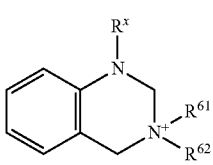

In Chemical Formula 2ea, $R^{61}$ and $R^{62}$ are each independently hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, and hydrogen of the aromatic ring (e.g., benzene ring) or hydrogen of (hetero)cycloalkyl may be replaced by a halogen (F, Cl, Br, or I) or a C1 to 010 alkyl group.

The organic ammonium cation (Chemical Formulas 2c, 2d, and 2e) may include a substituted or unsubstituted pyrrolidinium cation, a substituted or unsubstituted piperidinium cation, a substituted or unsubstituted pyridinium cation, pyridazinium cation, a substituted or unsubstituted pyrimidinium cation, a substituted or unsubstituted pyrazinium cation, a substituted or unsubstituted imidazolium cation, a substituted or unsubstituted pyrazolium cation, a substituted or unsubstituted thiazolium cation, a substituted or unsubstituted oxazolium cation, a substituted or unsubstituted triazolium cation, a substituted or unsubstituted piperazinium cation, a substituted or unsubstituted morpholinium cation, or a combination thereof.

The organic phosphonium cation may include a cation represented by Chemical Formula 2f.

Chemical Formula 2f

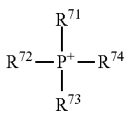

In Chemical Formula 2f, $R^{71}$, $R^{72}$, $R^{73}$, and $R^{74}$ are each independently hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, provided that at least one of $R^{71}$, $R^{72}$, $R^{73}$, or $R^{74}$ is a substituted or unsubstituted C3 to C30 alkyl group, a substituted or unsubstituted C3 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group.

Specific examples of the organic phosphonium cation represented by Chemical Formula 2f may include cations represented by Chemical Formulas 2fa-1 to 2fa-3.

Chemical Formula 2fa-1

(1) 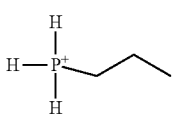

(2) 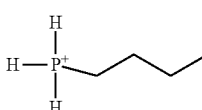

(3) 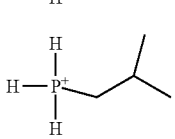

-continued

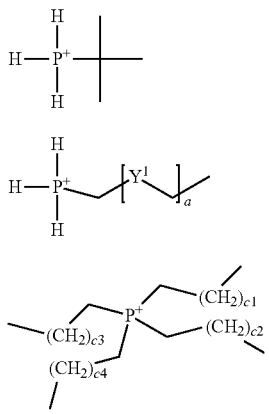

(4)

(5)

(6)

In Chemical Formula 2fa-1,
hydrogen in Chemical Formulas (1) to (6) may be replaced by a halogen (F, Cl, Br, or I) or a C1 to C10 alkyl group,
a non-adjacent $CH_2$ of the alkylene chains of Chemical Formulas (1) to (3) may be replaced by O, S, C(=O), C(=O)O, or OC(=O),
in Chemical Formula (5), $Y^1$ is O, S, C(=O), C(=O)O, or OC(=O), and a is an integer from 1 to 5, and
in Chemical Formula (6), c1 to c4 are each independently an integer of 1 to 10, and a non-adjacent $CH_2$ may be replaced by O, S, C(=O), C(=O)O, or OC(=O).

When hydrogen is replaced by a halogen (F) in Chemical Formulas (1) to (6) of Chemical Formula 2fa-1, a fluoroalkyl group or a perfluoroalkyl group may be provided.

Chemical Formula 2fa-2

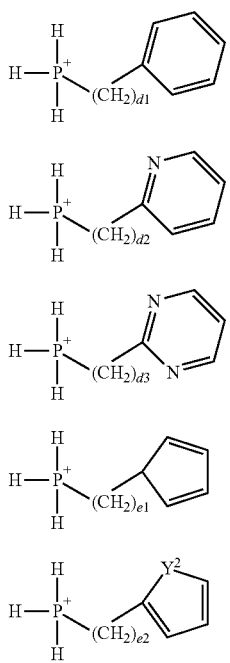

(7)

(8)

(9)

(10)

(11)

In Chemical Formula 2fa-2,
hydrogen in Chemical Formulas (7) to (11) may be replaced by a halogen (F, Cl, Br, or I) or a C1 to C10 alkyl group,
in Chemical Formula (11), $Y^2$ is O, S, C(=O), C(=O)O, or OC(=O) and a is an integer of 1 to 5, and
in Chemical Formulas (7) to (11), d1, d2, d3, e1, and e2 are each independently an integer of 1 to 10 and a non-adjacent $CH_2$ may be replaced by O, S, C(=O), C(=O)O, or OC(=O).

Chemical Formula 2fa-3

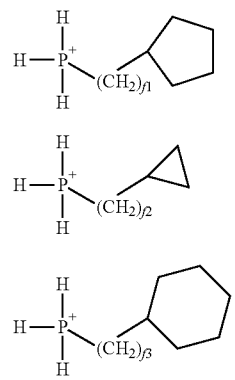

(12)

(13)

(14)

In Chemical Formula 2fa-3,
hydrogen in Chemical Formulas (12) to (14) may be replaced by a halogen (F, Cl, Br, or I) or a C1 to 010 alkyl group, and
in Chemical Formulas (12) to (14), f1, f2, and f3 are each independently an integer of 1 to 10 and a non-adjacent $CH_2$ may be replaced by O, S, C(=O), C(=O)O, or OC(=O). Herein, when f1, f2, and f3 are integers of 2 or more, the $CH_2$ may be a $CH_2$ of $(CH_2)_{f1}$, $(CH_2)_{f2}$, or $(CH_2)_{f3}$; or a $CH_2$ present inside (i.e., as a constituent of) the ring of cycloalkyl.

The organic sulfonium cation may include a cation represented by Chemical Formula 2g.

Chemical Formula 2g

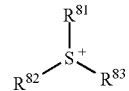

In Chemical Formula 2g,
$R^{81}$, $R^{82}$, and $R^{83}$ are each independently hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, provided that at least one of $R^{81}$, $R^{82}$, or $R^{83}$ is a substituted or unsubstituted C3 to C30 alkyl group, a substituted or unsubstituted C3 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group.

Specific examples of the organic sulfonium cation represented by Chemical Formula 2g may include cations represented by Chemical Formulas 2ga-1 to 2ga-3.

Chemical Formula 2ga-1

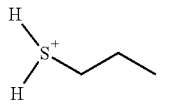

(1)

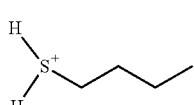

(2)

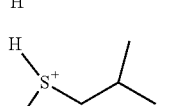

(3)

(4)

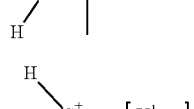

(5)

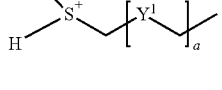

(6)

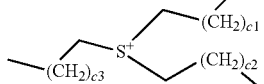

In Chemical Formula 2ga-1,
hydrogen in Chemical Formulas (1) to (6) may be replaced by a halogen (F, Cl, Br, or I) or a C1 to C10 alkyl group,
a non-adjacent $CH_2$ of the alkylene chains of Chemical Formulas (1) to (3) may be replaced by O, S, C(=O), C(=O)O, or OC(=O),
in Chemical Formula (5), $Y^1$ is O, S, C(=O), C(=O)O, or OC(=O), and a is an integer from 1 to 5, and
in Chemical Formula (6), c1 to c3 are each independently an integer of 1 to 10, and a non-adjacent $CH_2$ may be replaced by O, S, C(=O), C(=O)O, or OC(=O).

When hydrogen is replaced by a halogen (F) in Chemical Formulas (1) to (6) of Chemical Formula 2ga-1, a fluoroalkyl group or a perfluoroalkyl group may be provided.

Chemical Formula 2ga-2

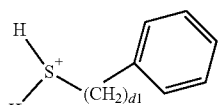

(7)

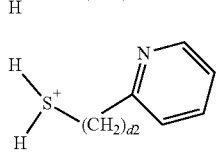

(8)

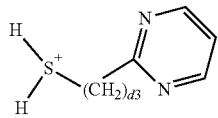

(9)

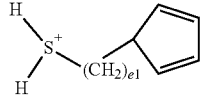

(10)

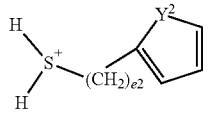

(11)

In Chemical Formula 2ga-2,
hydrogen of Chemical Formulas (7) to (11) may be replaced by a halogen (F, Cl, Br, or I) or a C1 to C10 alkyl group,
in Chemical Formula (11), $Y^2$ is O, S, C(=O), C(=O)O, or OC(=O) and a is an integer of 1 to 5, and
in Chemical Formulas (7) to (11), d1, d2, d3, e1, and e2 are each independently an integer of 1 to 10, a non-adjacent $CH_2$ may be replaced by O, S, C(=O), C(=O)O, or OC(=O).

Chemical Formula 2ga-3

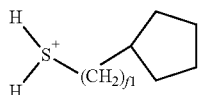

(12)

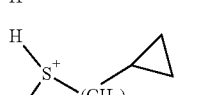

(13)

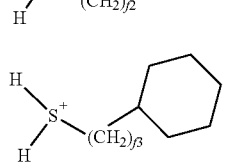

(14)

In Chemical Formula 2ga-3,
hydrogen in Chemical Formulas (12) to (14) may be replaced by a halogen (F, Cl, Br, or I) or a C1 to C10 alkyl group, and
in Chemical Formulas (12) to (14), f1, f2, and f3 are each independently an integer of 1 to 10 and a non-adjacent $CH_2$ may be replaced by O, S, C(=O), C(=O)O, or OC(=O). Herein, when f1, f2 and f3 are integers of 2 or more, the $CH_2$ may be a $CH_2$ of $(CH_2)_{f1}$, $(CH_2)_{f2}$, or $(CH_2)_{f3}$; or a $CH_2$ present inside the ring of cycloalkyl.

A ratio (T1:T2) of the thickness T1 of the first hole transport layer 12 to the thickness T2 of the second hole transport layer 13 may be greater than or equal to about 1.0:1, greater than about 1.0:1, greater than or equal to about 1.1:1, greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, greater than or equal to about 2.0:1, greater than or equal to about 2.1:1, greater than or equal to about 2.2:1, greater than or equal to about 2.3:1, greater than or equal to about 2.4:1, greater than or equal to about 2.5:1, greater than or equal to about 2.6:1, greater than or equal to about 2.7:1, greater than or equal to about 2.8:1, greater than or equal to about 2.9:1 or greater than or equal to about 3.0:1 and less than or equal to about 9.0:1, less than or equal to about 8.5:1, less than or equal to about 8.0:1, less than or equal to about 7.5:1, less than or equal to about 7.0:1, less than or equal to about 6.5:1, less than or equal to about 6.0:1, or less than or equal to about 5.5:1. When the ratio (T1:T2) of the thickness T1 of the first hole transport layer 12 and the thickness T2 of the second hole transport layer 13 is within the disclosed ranges, high hole mobility of the first hole transport layer 12 may be obtained, and an energy bandgap of the second hole transport layer 13 may be increased to secure electron blocking properties.

The energy bandgap of the first hole transport layer 12 may be in the range of greater than or equal to about 2.0 eV, greater than or equal to about 2.1 eV, or greater than or equal to about 2.3 eV and less than or equal to about 2.4 eV. The energy bandgap of the second hole transport layer 13 may be greater than or equal to about 2.5 eV, greater than or equal to about 2.6 eV, greater than or equal to about 2.7 eV, or greater than or equal to about 2.8 eV and less than or equal to about 4.0 eV, less than or equal to about 3.9 eV, less than or equal to about 3.8 eV, less than or equal to about 3.7 eV, less than or equal to about 3.6 eV, less than or equal to about 3.5 eV, less than or equal to about 3.4 eV, or less than or equal to about 3.3 eV. A difference between the energy bandgap of the first hole transport layer 12 and the energy bandgap of the second hole transport layer 13 may be greater than or equal to about 0.1 eV, greater than or equal to about 0.2 eV, greater than or equal to about 0.3 eV, or greater than or equal to about 0.4 eV and less than or equal to about 2.0 eV, less than or equal to about 1.9 eV, less than or equal to about 1.8 eV, less than or equal to about 1.7 eV, less than or equal to about 1.6 eV, less than or equal to about 1.5 eV, less than or equal to about 1.4 eV, less than or equal to about 1.3 eV, less than or equal to about 1.2 eV, less than or equal to about 1.1 eV, or less than or equal to about 1.0 eV. When a difference between the energy bandgap of the first hole transport layer 12 and the energy bandgap of the second hole transport layer 13 is in the disclosed ranges, high hole mobility of the first hole transport layer 12 may be obtained, and electron blocking properties of the second hole transport layer 13 may be secured.

Each valence band of the first hole transport layer 12 and the second hole transport layer 13 may be present between the work function of the first electrode 11 and the HOMO energy level of the quantum dot layer 14. For example, the work function of the first electrode 11, the first valence band of the first hole transport layer 12, the second valence band of the second hole transport layer 13, and the HOMO energy level of the quantum dot layer 14 may be gradually deep, e.g., vary gradually, and may have for example a stepped shape.

The second hole transport layer 13 may have a relatively deep, e.g., large, valence band to match the HOMO energy level of the quantum dot layer 14. Accordingly, the mobility of holes transferred from the first hole transport layer 12 and the second hole transport layer 13 to the quantum dot layer 14 may be increased.

The valence band of the second hole transport layer 13 may be less than or equal to the HOMO energy level of the quantum dot layer 14 within a range of less than or equal to about 1.0 eV, e.g., a difference between a HOMO energy level of the quantum dot layer and an energy level of a valence band of the second hole transport layer may be 0 eV to about 1.0 eV. For example, a difference between the valence band of the first hole transport layer 12 and the second hole transport layer 13 and the HOMO energy level of the quantum dot layer 14 may be about 0 eV to about 1.0 eV, for example about 0.01 eV to about 0.8 eV, about 0.01 eV to about 0.7 eV, about 0.01 eV to about 0.5 eV, about 0.01 eV to about 0.4 eV, about 0.01 eV to about 0.3 eV, about 0.01 eV to about 0.2 eV, or about 0.01 eV to about 0.1 eV.

The valence band of the second hole transport layer 13 may be, for example, greater than or equal to about 5.0 eV, for example, greater than or equal to about 5.2 eV, greater than or equal to about 5.4 eV, greater than or equal to about 5.6 eV, or greater than or equal to about 5.8 eV. For example, the valence band of the second hole transport layer 13 may be in the range of about 5.0 eV to about 7.0 eV, for example about 5.2 eV to about 6.8 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, about 5.4 eV to about 6.1 eV, about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, about 5.6 eV to about 6.1 eV, about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, or about 5.8 eV to about 6.1 eV.

The second hole transport layer 13 may have a conduction band shallower, e.g., smaller, than the LUMO energy level of the quantum dot layer 14. Accordingly, the mobility of electrons transferred from the second electrode 15 to the quantum dot layer 14 may be blocked.

The conduction band of the second hole transport layer 13 may be, for example, less than or equal to about 3.0 eV, for example less than or equal to about 2.9 eV, less than or equal to about 2.8 eV, less than or equal to about 2.7 eV, less than or equal to about 2.6 eV, or less than or equal to about 2.5 eV.

The conduction band of the second hole transport layer 13 may be greater than the LUMO energy level of the quantum dot layer 14, by, e.g., a difference between an energy level of a conduction band of the second hole transport layer and a LUMO energy level of the quantum dot layer may be, greater than or equal to about 0.5 eV, for example, greater than or equal to about 0.6 eV, greater than or equal to about 0.7 eV, greater than or equal to about 0.8 eV, greater than or equal to about 0.9 eV, greater than or equal to about 1.0 eV, greater than or equal to about 1.1 eV, greater than or equal to about 1.2 eV, greater than or equal to about 1.3 eV, greater than or equal to about 1.4 eV, or greater than or equal to about 1.5 eV. For example, the difference between the conduction band of the second hole transport layer 13 and the LUMO energy level of the quantum dot layer 14 may be less than or equal to about 2.0 eV, for example less than or equal to about 1.9 eV, less than or equal to about 1.8 eV, less than or equal to about 1.7 eV, or less than or equal to about 1.6 eV.

The quantum dot device 10 may further include an electron injection layer (not shown) including inorganic nanoparticles or an organic material between the quantum dot layer 14 and the second electrode 15.

The inorganic nanoparticles may be two-dimensional or three-dimensional nanoparticles having an average particle diameter of less than or equal to about 10 nm, for example, less than or equal to about 9 nm, less than or equal to about 8 nm, less than or equal to about 7 nm, less than or equal to about 5 nm, less than or equal to about 4 nm, or less than or equal to about 3.5 nm, within the disclosed range, about 1 nm to about 10 nm, about 1 nm to about 9 nm, about 1 nm to about 8 nm, about 1 nm to about 7 nm, about 1 nm to about 5 nm, about 1 nm to about 4 nm, or about 1 nm to about 3.5 nm.

For example, the inorganic nanoparticles may be hydrophilic metal oxide nanoparticles dispersible in a polar dispersion medium, wherein the polar dispersion medium may be, for example, water; alcohols such as methanol, ethanol, propanol, and butanol; or a combination thereof.

The inorganic nanoparticles may include metal oxide nanoparticles represented by $Zn_{1-x}Q_xO$, wherein Q is a metal other than Zn, and $0 \leq x < 0.5$.

Q may include Mg, Ce, Co, Ni, Ga, Al, Ca, Zr, W, Li, Ti, Ta, Sn, Hf, Si, Ba, or a combination thereof.

Specific examples of the inorganic nanoparticles may be an oxide of $TiO_2$, $CeO_2$, $SnO_2$, MgO, $ZrO_2$, $WO_3$, $Al_2O_3$, or a combination thereof, but is not limited thereto.

The organic material included in the electron injection layer may include 1,4,5,8-naphthalene-tetracarboxylic dianhydride (NTCDA), bathocuproine (BCP), tris[3-(3-pyridyl)-mesityl]borane (3TPYMB), Li F, tris-(8-hydroxyquinolinato)aluminum ($Alq_3$), tris(8-hydroxyquinolinato)gallium ($Gaq_3$), tris-(8-hydroxyquinolinato)indium ($Inq_3$), bis-(8-hydroxyquinolinato)zinc ($Znq_2$), bis(2-(2-hydroxyphenyl)benzothiazolate)zinc ($Zn(BTZ)_2$), bis(10-hydroxybenzo[h]quinolinato)beryllium ($BeBq_2$), 8-(4-(4,6-di(naphthalen-2-yl)-1,3,5-triazin-2-yl)phenyl)quinolone (ET204), 8-hydroxyquinolinato lithium (Liq), an n-type metal oxide (e.g., ZnO, $HfO_2$, etc.) or a combination thereof, but is not limited thereto.

The electron injection layer may have a structure of two or more layers.

The LUMO energy level of the electron injection layer may be a value that is present between the work function of the second electrode 15 and the LUMO energy level of the quantum dot layer 14. For example, the LUMO energy levels of the second electrode 15, the electron injection layer, and the quantum dot layer 14 may be sequentially shallow, e.g., the LUMO energy level of the second electrode 15 may be greater than the LUMO energy level of the electron injection layer, which is greater than the LUMO energy level of the quantum dot layer 14. For example, the LUMO energy level of the electron injection layer may be shallower, e.g., less, than the work function of the second electrode 15, and the LUMO energy level of the quantum dot layer 14 may be shallower, e.g., less, than the LUMO energy level of the electron injection layer. That is, the work function of the second electrode 15, the LUMO energy level of the electron injection layer, and the LUMO energy level of the quantum dot layer 14 may have a cascading energy level that becomes shallower, e.g., smaller, in sequence along, e.g., in, one direction.

For example, a difference between the work function of the second electrode 15 and the LUMO energy level of the electron injection layer may be less than about 0.5 eV, for example, about 0.001 eV to about 0.5 eV, about 0.001 eV to about 0.4 eV, or about 0.001 eV to about 0.3 eV. For example, the difference between the LUMO energy level of the electron injection layer and the LUMO energy level of the quantum dot layer 14 may be less than about 0.5 eV, for example about 0.001 eV to about 0.5 eV, about 0.001 eV to about 0.4 eV, or about 0.001 eV to about 0.3 eV. Accordingly, the injection of electrons from the second electrode 15 into the electron injection layer may facilitate lowering a driving voltage of the quantum dot device 10, and electrons may be effectively transferred from the electron injection layer to the quantum dot layer 14, resulting in increase of efficiency. The LUMO energy level of the electron injection layer may be about 3.4 eV to about 4.8 eV, about 3.4 eV to about 4.6 eV, about 3.4 eV to about 4.5 eV, about 3.6 eV to about 4.8 eV, about 3.6 eV to about 4.6 eV, about 3.6 eV to about 4.5 eV, about 3.6 eV to about 4.3 eV, about 3.9 eV to about 4.8 eV, about 3.9 eV to about 4.6 eV, about 3.9 eV to about 4.5 eV, or about 3.9 eV to about 4.3 eV, within a range satisfying the aforementioned energy level.

The quantum dot device 10 may further include a hole injection layer including an organic material or an inorganic material between the first electrode 11 and the first hole transport layer 12.

In addition, the quantum dot device 10 may further include an additional hole transport layer including an organic material or an inorganic material to improve hole transport properties.

The organic or inorganic material included in the hole injection layer, the additional hole transport layer, or a combination thereof may include poly(3,4-ethylenedioxythiophene):poly(styrenesulfonate) (PEDOT:PSS), poly(9,9-dioctyl-fluorene-co-N-(4-butylphenyl)-diphenylamine (TFB), polyarylamine, poly(N-vinylcarbazole) (PVK), polyaniline, polypyrrole, N, N, N',N'-tetrakis(4-methoxyphenyl)-benzidine (TPD), N,N'-bis(naphthalen-1-yl)-N,N'-bis(phenyl)-2,2'-dimethylbenzidine (α-NPD), 4,4',4"-tris[phenyl(m-tolyl)amino]triphenylamine (m-MTDATA), 4,4',4"-tris(N-carbazolyl)-triphenylamine (TCTA), 1,1-bis[(di-4-tolylamino)phenylcyclohexane (TAPC), a p-type metal oxide (e.g., NiO, $WO_3$, $MoO_3$, etc.), a carbon-based material such as graphene oxide, or a combination thereof, but is not limited thereto.

The quantum dot device 10 having the aforementioned configuration may exhibit excellent efficiency.

A method of manufacturing the quantum dot device 10 may include forming a first electrode 11 on a substrate (not shown), coating a first composition including the perovskite compound represented by Chemical Formula 1 on the first electrode 11 and then annealing to form a first hole transport layer 12, coating a second composition including a structure-inducing compound represented by Chemical Formula 2' on the first hole transport layer 12 and then annealing to form a second hole transport layer 13, forming a quantum dot layer 14 on the second hole transport layer 13, and forming a second electrode on the quantum dot layer 14.

A'X'  Chemical Formula 2'

In Chemical Formula 2',
A' is an organic ammonium cation, an organic amidinium cation, an organic phosphonium cation, an organic sulfonium cation, or a derivative thereof, wherein the organic ammonium cation, the organic phosphonium cation, or the organic sulfonium cation includes a substituted or unsubstituted C3 to C30 alkyl group, a substituted or unsubstituted C3 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, and
X' is a halide ion.

A method of manufacturing the quantum dot device will be described in detail.

First, the first electrode 11 or the first electrode 11 and a hole injection layer (not shown) are formed on a substrate, and the first composition including a perovskite compound represented by Chemical Formula 1 is coated thereon and annealed, forming the first hole transport layer 12. The first hole transport layer 12 is a three-dimensional structure perovskite thin film.

On the first hole transport layer 12, a solution (the second composition) including a compound represented by Chemical Formula 2' is coated thereon and annealed, forming a two-dimensional structure perovskite thin film. Although not bound by a particular theory, an organic group represented by A' included in Chemical Formula 2', such as an organic ammonium cation, an organic amidinium cation, an organic phosphonium cation, an organic sulfonium cation, or a derivative thereof, is penetrated into a perovskite thin film structure of the three-dimensional structure to include the two-dimensional structure.

The first hole transport layer 12, the second hole transport layer 13, and the quantum dot layer 14 may be formed in a solution process, for example, spin coating, slit coating, inkjet printing, nozzle printing, spraying, doctor blade coating, or a combination thereof, but is not limited thereto.

The annealing after coating the first and second compositions for forming the first hole transport layer 12 and the second hole transport layer 13 may be for example performed at about 50° C. to about 300° C., for example, about 70° C. to about 200° C. for about 1 minute to about 10 hours, but is not limited thereto.

For example, the forming of the first hole transport layer 12 may include coating the first composition in a solution state, which is obtained by dissolving the perovskite compound represented by Chemical Formula 1 in a solvent, and optionally, drying the same, annealing the same, or a combination thereof. The solvent may be for example water; alcohol such as methanol, ethanol, propanol, or butanol; or a combination thereof, but is not limited thereto.

For example, the forming the second hole transport layer 13 may include coating the second composition obtained by dissolving the compound represented by Chemical Formula 2' in a solvent and optionally, drying the same, annealing the same, or a combination thereof. The solvent may be for example water; alcohol such as methanol, ethanol, propanol, or butanol; or a combination thereof, but is not limited thereto.

The temperature and time of the annealing may be controlled to adjust each thickness of the first hole transport layer 12 and the second hole transport layer 13.

The quantum dot device may be a light emitting device, a photodetector, or an optical sensor.

According to an embodiment, a thin film of a multilayered structure including a first hole transport layer including a three-dimensional structure perovskite thin film and a second hole transport layer including a two-dimensional structure perovskite thin film is provided. The three-dimensional structure perovskite thin film and the two-dimensional structure perovskite thin film are the same as described in the quantum dot device. These thin films of the multilayered structure may be applied as a hole transport layer to various devices.

The aforementioned quantum dot device and thin film of, e.g., having, the multilayered structure may be applied to, e.g., used in, various electronic devices including light emission, for example, a display device such as a photodetector, a sensor (e.g., an image sensor), television (TV), a monitor, a computer, a mobile, and the like or a lighting device such as a light source and the like.

Hereinafter, the embodiments are illustrated in more detail with reference to examples. However, these examples are exemplary, and the present scope is not limited thereto.

Preparation Example 1: Preparation of Quantum Dot Dispersion

Preparation Example 1-1

(1) Preparation of ZnTeSe Core Quantum Dot Dispersion

Selenium (Se) and tellurium (Te) are respectively dispersed in trioctylphosphine (TOP) to obtain a 2 moles per liter (molar (M)) Se/TOP stock solution and a 0.1 M Te/TOP stock solution.

An amount of 0.125 millimoles (mmol) of zinc acetate is put with 0.25 mmol of oleic acid and 0.25 mmol of hexadecylamine and 10 milliliters (mL) of trioctylamine in a reactor and then, heated under vacuum at 120° C. After 1 hour, an atmosphere in the reactor is converted into nitrogen.

After heating the reactor at 240° C., the Se/TOP stock solution and the Te/TOP stock solution in a Te:1Se mole ratio of 1:125 are rapidly injected thereinto. The reaction solution is heated up to 300° C., maintained for 30 minutes, and then, rapidly cooled down to room temperature, acetone is added thereto, and precipitates obtained therefrom through centrifugation are dispersed in toluene to obtain ZnTeSe core quantum dot dispersion.

(2) Preparation of ZnTeSe Core/ZnSeS Shell Quantum Dot Dispersion

In a 10 mL flask, trioctylamine is added. Subsequently, 0.6 mmol of zinc acetate and 1.2 mmol of oleic acid are added thereto and then, vacuum-treated at 120° C. for 10 minutes. Then, the atmosphere in the flask is internally substituted with nitrogen ($N_2$), the ZnTeSe core quantum dot dispersion is rapidly injected thereinto, and the 2 M Se/TOP and the 1 M S/TOP in a Se:S mole ratio of 1.2:2.8 are injected thereinto and then, heated up to 340° C. to perform a reaction. When the reaction is complete, the reactor is cooled down, nanocrystals are centrifuged with ethanol and then, dispersed in toluene to obtain ZnTeSe core/ZnSeS shell quantum dot dispersion.

Preparation Example 1-2

(1) Preparation of InP Core Quantum Dot Dispersion

In a 200 mL reaction flask, indium acetate and palmitic acid are dissolved in 1-octadecene and then, heated at 120° C. under vacuum. Herein, indium and palmitic acid have a mole ratio of 1:3. After 1 hour, an atmosphere in the reactor is converted into nitrogen. Subsequently, after heating the reactor at 280° C., a mixed solution of tris(trimethylsilyl)phosphine (TMS3P) and trioctylphosphine is rapidly injected thereinto and then, reacted for 20 minutes. Herein, TMS3P is used in an amount of 0.5 moles per 1 mole of indium. Subsequently, acetone is added to the reaction solution cooled down to room temperature, and then, precipitates centrifuged therefrom are dispersed again in toluene to prepare InP core quantum dot dispersion. The InP core quantum dot has a particle diameter of about 3 nanometers (nm).

(2) Preparation of InP Core/ZnSe Shell/ZnS Shell Quantum Dot Dispersion

Selenium (Se) is dispersed in trioctylphosphine (TOP) to prepare a Se/TOP stock solution, and sulfur (S) is dispersed in trioctylphosphine (TOP) to prepare a S/TOP stock solution.

In a 200 mL reaction flask, zinc acetate and oleic acid are dissolved in trioctylamine and then, vacuum-treated at 120° C. for 10 minutes. Subsequently, the atmosphere in the reaction flask is internally substituted with $N_2$ and heated up to 180° C., and then, the InP core quantum dot dispersion is added thereto.

The obtained mixture is heated up to 280° C., Se/TOP is injected thereinto and then, reacted, the obtained mixture is heated again up to 320° C., and the rest of Se/TOP is injected thereinto and then, reacted for predetermined time to form a ZnSe shell on the InP core. Subsequently, the S/TOP stock solution is put in the reaction mixture and reacted therewith for predetermined time to form a ZnS shell on the ZnSe shell to obtain an InP core/ZnSe shell/ZnS shell quantum dot. The ZnSe shell is formed for total reaction time of 60 minutes, and a total amount of Se is about 20 moles based on 1 mole of indium, and the ZnS shell is also formed for total reaction time of 60 minutes, and a total amount of S is about 10 moles based on 1 mole of indium.

The obtained InP core/ZnSe shell/ZnS shell quantum dot is added to an excessive amount of ethanol and then, centrifuged. After the centrifugation, a supernatant is poured out, and precipitates therefrom are dried and dispersed in chloroform or toluene to obtain InP core/ZnSe shell/ZnS shell quantum dot dispersion.

Example 1: Manufacture of Thin Film Having Multilayered Structure

Example 1A: Manufacture of First Hole Transport Layer ($FAPbBr_3$)

In a glove box, 183.5 milligrams (mg) (0.5 mmol) of $PbBr_2$ and 62.5 mg (0.5 mmol) of FABr (formamidinium bromide) are dissolved in a solvent (1 mL) of dimethyl formamide/dimethyl sulfoxide (DMF:DMSO, 7:3 volume ratio (v/v)) at a concentration of 0.5 M, obtaining a solution. The obtained solution is spin-coated on a substrate under the condition of 3,000 revolutions per minute (rpm) and 60 seconds (s). After 30 s during the spin coating, 0.3 mL of chlorobenzene is dropped in the center of the substrate and then, annealed at 250° C. for 10 minutes, forming a first hole transport layer including $FAPbBr_3$.

Example 1B: Manufacture of Second Hole Transport Layer

A butyl ammonium bromide solution (0.01 M in IPA) is prepared. On the first hole transport layer of Example 1A, the prepared solution is spin-coated under the condition of 3,000 rpm and 20 s and then, annealed at 120° C. for 10 minutes, forming a second hole transport layer.

The first hole transport layer has a thickness of 40 nm, and the second hole transport layer has a thickness of 10 nm.

Example 2: Manufacture of Thin Film Having Multilayered Structure

Example 2A: Manufacture of First Hole Transport Layer ($CsPbBr_3$)

A $PbBr_2$ solution (0.5 M in DMF) and a CsBr solution (0.07 M in methanol) are prepared under an air atmosphere. The $PbBr_2$ solution is coated under the condition of 3,000 rpm and 30 s and then, annealed at 100° C. for 10 minutes to first form a $PbBr_2$ thin film. The obtained thin film is cooled to room temperature of 25° C., and the CsBr solution is coated on the $PbBr_2$ thin film under the condition of 3,000 rpm and 30 s and then, annealed at 250° C. for 5 minutes. Then, the CsBr solution is additionally coated under the condition of 3,000 rpm and 30 s and annealed at 250° C. for 5 minutes, and the CsBr solution is additionally coated under the condition of 3,000 rpm and 30 s and then, annealed at 250° C. for 10 minutes, forming a first hole transport layer including $CsPbBr_3$.

Example 2B: Manufacture of Second Hole Transport Layer

A butylammonium bromide solution (0.01 M in IPA) is prepared. On the first hole transport layer of Example 1A, the solution is spin-coated under the condition of 3,000 rpm and 20 s and then, annealed at 120° C. for 10 minutes, forming a second hole transport layer.

The first hole transport layer has a thickness of 40 nm, and the second hole transport layer has a thickness of 15 nm.

Example 3: Manufacture of Thin Film Having Multilayered Structure

A perovskite thin film is formed in the same manner as Example 1 except that the second hole transport layer is formed by using benzyl ammonium bromide instead of the butylammonium bromide.

Example 4: Manufacture of Thin Film Having Multilayered Structure

A perovskite thin film is formed in the same manner as Example 2 except that the second hole transport layer is formed by using benzyl ammonium bromide instead of the butylammonium bromide.

Example 5: Manufacture of Thin Film Having Multilayered Structure

A perovskite thin film is formed in the same manner as Example 1 except that the second hole transport layer is formed by using phenethyl ammonium bromide instead of the butylammonium bromide.

Example 6: Manufacture of Thin Film Having Multilayered Structure

A perovskite thin film is formed in the same manner as Example 2 except that the second hole transport layer is formed by using phenethyl ammonium bromide instead of the butylammonium bromide.

Example 7: Manufacture of HOD (Hole Only Device)

First, a first hole transport layer and a second hole transport layer (HTL) are formed on an indium tin oxide (ITO) substrate in the same manner as Example 1. Then, an electron blocking layer is formed thereon by depositing $MoO_3$ to be 10 nm thick, and an Ag electrode is consecutively deposited thereon to be 120 nm thick, obtaining an HOD device.

The HOD device has a structure of ITO (150 nm)/HTL (50 nm), first HTL (40 nm)/second HTL (10 nm)/$MoO_3$ (10 nm)/Ag (120 nm).

Example 8: Manufacture of HOD (Hole Only Device)

First, NiOx (0<x<2) is spin-coated to be 30 nm thick on an ITO substrate, forming a hole injection layer. Subsequently, a first hole transport layer and a second hole transport layer are formed in the same method as Example 1. Then, an electron blocking layer is formed thereon by depositing $MoO_3$ to be 10 nm thick, and an Ag electrode is consecutively deposited thereon to be 120 nm thick, obtaining an HOD device.

The HOD device has a structure of ITO (150 nm)/HIL 30 nm/HTL (50 nm), first HTL (40 nm)/second HTL (10 nm)/$MoO_3$ (10 nm)/Ag (120 nm).

Example 9: Manufacture of HOD (Hole Only Device)

First, a first hole transport layer (HTL) and a second hole transport layer (HTL) are formed on an ITO substrate in the same manner as Example 2

Subsequently, an electron blocking layer is formed thereon by depositing $MoO_3$ to be 10 nm thick, and consecutively, an Ag electrode is deposited thereon to be 120 nm thick, obtaining an HOD device.

The HOD device has a structure of ITO (150 nm)/HTL (50 nm, first HTL (40 nm)/second HTL (10 nm))/$MoO_3$ (10 nm)/Ag (120 nm).

Example 10: Manufacture of HOD (Hole Only Device)

First, NiOx (0<x<2) is spin-coated to be 30 nm thick on an ITO substrate to form a hole injection layer. Subsequently, a first hole transport layer and a second hole transport layer are formed thereon in the same manner as Example 2. Then, an electron blocking layer is formed thereon by depositing $MoO_3$ to be 10 nm thick, and consecutively, an Ag electrode is deposited thereon to be 120 nm thick, obtaining a HOD device.

The HOD device has a structure of ITO (150 nm)/HIL (30 nm)/HTL (50 nm, first HTL (40 nm)/second HTL (10 nm))/$MoO_3$ (10 nm)/Ag (120 nm).

Comparative Example 1: Manufacture of HOD (Hole Only Device)

First, NiOx (0<x<2) is coated to be 30 nm thick on an ITO substrate to from a hole injection layer. Subsequently, a hole transport layer is formed thereon in the same manner as Example 2A. On the hole transport layer, an electron blocking layer is formed by depositing $MoO_3$ to be 10 nm thick, and consecutively, an Ag electrode is deposited thereon to be 120 nm thick, obtaining an HOD device.

The HOD device has a structure of ITO (150 nm)/HIL (30 nm)/HTL (50 nm, single layer, 3D perovskite)/$MoO_3$ (10 nm)/Ag.

Example 11: Manufacture of Quantum Dot Device

A glass substrate on which ITO (work function: −4.8 electronvolts (eV)) is deposited as a first electrode (anode) is surface-treated with an ultraviolet (UV)-ozone for 15 minutes, and then, a first hole transport layer and a second hole transport layer are formed thereon in the same manner as Example 1.

Subsequently, InP/ZnSe/ZnS core-shell-shell red quantum dots (average particle diameter: 12 nm, peak wavelength: about 630 nm, highest occupied molecular orbital (HOMO) energy level: −5.5 eV, lowest unoccupied molecular orbital (LUMO) energy level: −3.6 eV) with oleate attached as a hydrophobic ligand on the surfaces are added to octane and then, stirred for 5 minutes, preparing a composition for a red emission layer. The composition for a red emission layer is spin-coated on the second hole transport layer and heat-treated at 150° C. for 30 minutes under a nitrogen atmosphere to form a 20 nm-thick red emission layer (quantum dot layer).

On the red emission layer, a composition for an electron transport layer in which 100 parts by weight of the prepared $Zn_{0.85}Mg_{0.15}O$ (average particle diameter: 3 nm, HOMO energy level: −7.7 eV, LUMO energy level: −4.3 eV) and 100 parts by weight of tetraethyl orthosilicate (TEOS) are dispersed in ethanol is spin-coated and then, heat-treated at 80° C. for 30 minutes, forming a 20 nm-thick electron transport layer. $Zn_{0.85}Mg_{0.15}O$ is prepared by dissolving 3.06 mmol of zinc acetate dihydrate, 0.54 mmol of magnesium acetate tetrahydrate, and 30 mL of dimethyl sulfoxide in a reactor. Subsequently, 5.5 mmol of tetramethylammonium hydroxide pentahydrate (TMAH) is dissolved in 10 mL of ethanol and then, added to the reactor. After stirring the obtained mixture at room temperature (25° C.) for 1 hour, the prepared $Zn_{0.85}Mg_{0.15}O$ nanoparticles and ethyl acetate are centrifuged in a volume ratio of 1:4 and dispersed in ethanol, obtaining a composition for an electron transport layer including the $Zn_{0.85}Mg_{0.15}O$ nanoparticles (average particle diameter: about 3 nm).

On the electron transport layer, aluminum (work function: −4.3 eV) is vacuum-deposited to form a 100 nm-thick upper electrode, manufacturing a light emitting device (quantum dot device) of Example 9.

Example 12: Manufacture of Quantum Dot Device

A light emitting device (quantum dot device) is manufactured in the same manner as Example 10 except that a first hole transport layer and a second hole transport layer are formed on the hole injection layer in the same manner as Example 2.

Example 13: Manufacture of Quantum Dot Device

A glass substrate on which ITO (work function: −4.8 eV) is deposited a as a first electrode (anode) is surface-treated with a UV-ozone for 15 minutes, and then, a 30 nm-thick NiOx hole injection layer is formed in the following method. 10 mmol of nickel nitrate hexahydrate is dissolved in 1.7 mL of a co-solvent of ethylene glycol and 0.6 mL of ethylenediamine. This solution is stirred for about two days until completely dissolved, preparing a stock solution. 100 microliters (μL) of the stock solution is diluted in 800 μL of 2-methoxyethanol, before formed into a thin film. The diluted NiO precursor solution is spin-coated on a washed ITO substrate under the condition of 3,000 rpm and 30 s and put on a hot plate set at 100° C. After changing the temperature of the hot plate from 100° C. to 330° C., the coated substrate is annealed for 1 hour.

On the hole injection layer, a first hole transport layer and a second hole transport layer are formed in the same manner as Example 1.

Subsequently, InP/ZnSe/ZnS core-shell-shell red quantum dots (average particle diameter: 12 nm, peak wavelength: about 630 nm, HOMO energy level: −5.5 eV, LUMO energy level: −3.6 eV) with oleate as a hydrophobic ligand on the surfaces are added to octane and then, stirred for 5 minutes, preparing a composition for a red emission layer. The composition for a red emission layer is spin-coated on the second hole transport layer and then, heat-treated at 150° C. for 30 minutes under a nitrogen atmosphere, forming a 20 nm-thick red emission layer (quantum dot layer).

On the red emission layer, a composition for an electron transport layer in which 100 parts by weight of $Zn_{0.85}Mg_{0.15}O$ (average particle diameter: 3 nm, HOMO energy level: −7.7 eV, LUMO energy level: −4.3 eV) and 100 parts by weight of tetraethyl orthosilicate (TEOS) are dispersed in ethanol is spin-coated and then, heat-treated at 80° C. for 30 minutes, forming a 20 nm-thick electron transport layer. The $Zn_{0.85}Mg_{0.15}O$ is prepared by dissolving 3.06 mmol of zinc acetate dihydrate, 0.54 mmol of magnesium acetate tetrahydrate, and 30 mL of dimethyl sulfoxide in a reactor. Subsequently, 5.5 mmol of tetramethylammonium hydroxide pentahydrate (TMAH) is dissolved in 10 mL of ethanol and then, added to the reactor. After stirring the obtained mixture at room temperature (25° C.) for 1 hour, the prepared $Zn_{0.85}Mg_{0.15}O$ nanoparticles and ethyl acetate are centrifuged in a volume ratio of 1:4 and dispersed in ethanol, obtaining a composition for an electron transport layer including the $Zn_{0.85}Mg_{0.15}O$ nanoparticles (average particle diameter: about 3 nm).

On the electron transport layer, aluminum (work function: −4.3 eV) is vacuum-deposited to form a 100 nm-thick upper electrode, manufacturing a light emitting device (quantum dot device) of Example 9.

Example 14: Manufacture of Quantum Dot Device

A light emitting device (quantum dot device) of Example 10 is manufactured in the same manner as Example 11 except that a first hole transport layer and a second hole transport layer are formed on the hole injection layer in the same manner as Example 2.

Figure 2:
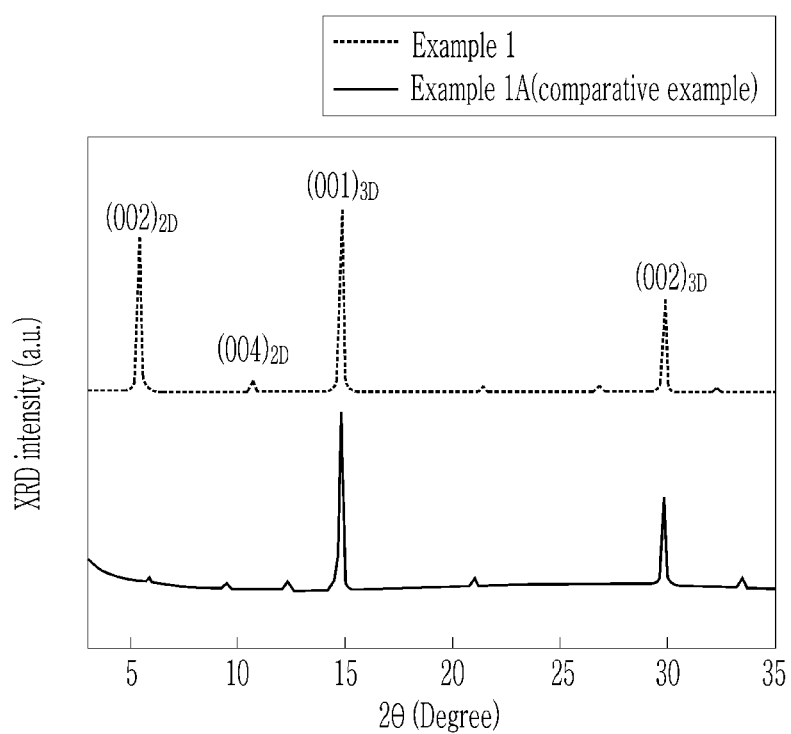
FIG. 2 is a graph of X-ray diffraction (XRD) intensity (arbitrary units (a.u.)) versus 2Θ (degree) of the thin film having a multilayered structure prepared in Example 1 and the thin film of Example 1A (comparative example)

Evaluation 1: X-Ray Diffraction Analysis of Thin Films Having Multilayered Structure An X-ray diffraction analysis is conducted with respect to the thin film of a multilayered structure of Example 1 and the thin film of Example 1A (corresponding to the comparative example), and the results are shown in FIG. 2. FIG. 2 shows the X-ray diffraction analysis results of the thin film of a multilayered structure of Example 1 and the thin film of Example 1A. Referring to FIG. 2, the thin film of Example 1 further exhibits a peak corresponding to a three-dimensional structure, compared with the thin film of Example 1A.

Evaluation 2: Hole Mobility

Hole mobility of the HOD devices of Example 9 and Comparative Example 1 is calculated according to Equation 1 (Mott Gurney Law), and the results are shown in Table 1.

$$J = \frac{9}{8}\varepsilon\mu\frac{Va^2}{L^3} (J \propto Va^2)$$ Equation 1

In Equation 1, J indicates current density, ε (epsilon) indicates a dielectric constant, μ (mu) indicates mobility, $V_a$ indicates a voltage applied thereto, L indicates a thickness of a hole transport layer (a thickness sum of first and second HTLs in a thin film of a composite multi-layer structure).

TABLE 1

| | Average mobility (square centimeters per volt second ($cm^2/Vs$), 10 pixels) |
|---|---|
| Comparative Example 1 | 0.11 |
| Example 9 | 0.10 |

Referring to Table 1, although a second hole transport layer is formed, hole transport properties are not greatly deteriorated.

Evaluation 3: Luminance Intensity

Figure 3:
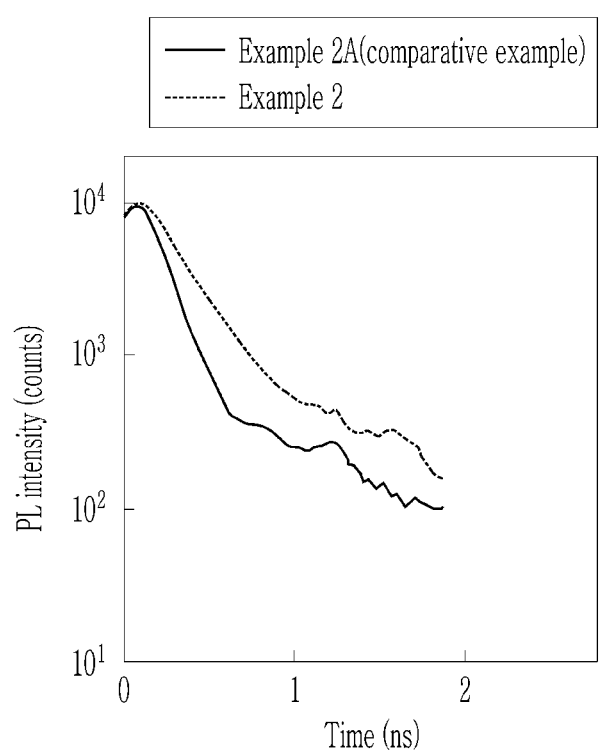
FIG. 3 is a graph of photoluminescence (PL) intensity (counts) versus time (nanoseconds (ns)) of the thin film having a multilayered structure of Example 2 and the thin film of Example 2A (comparative example).

Photoluminescence (luminescence) intensity of the perovskite thin films of Example 2 and Example 2A (comparative example) when irradiated by a laser is measured in a photoluminescence spectroscopy method, and the results are shown in FIG. 3. FIG. 3 is a graph showing the photoluminescence intensity of the thin film of a multilayered structure of Example 2 and the thin film of Example 2A. Referring to FIG. 3, the thin film of a multilayered structure of Example 2 exhibits excellent photoluminescence intensity compared with the thin film of Example 2A.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

10: quantum dot device
11: first electrode
15: second electrode
12: first hole transport layer
13: second hole transport layer
14: quantum dot layer

What is claimed is:

1. A quantum dot device, comprising
a first electrode and a second electrode,
a quantum dot layer disposed between the first electrode and the second electrode, and
a hole transport layer disposed between the quantum dot layer and the first electrode,
wherein the hole transport layer comprises
a first hole transport layer comprising a three-dimensional structure perovskite thin film, and
a second hole transport layer comprising a two-dimensional structure perovskite thin film,
wherein an energy bandgap of the first hole transport layer is in a range of about 2.0 electronvolts to about 2.4 electronvolts, and
an energy bandgap of the second hole transport layer is in a range of about 2.5 electronvolts to about 4.0 electronvolts.

2. The quantum dot device of claim 1, wherein the three-dimensional structure perovskite thin film comprises a perovskite compound represented by Chemical Formula 1:

$AMX_3$ Chemical Formula 1 wherein, in Chemical Formula 1,
A is an ammonium cation having a C1 or C2 alkyl group, an ammonium cation having a C1 or C2 haloalkyl group, an ammonium cation having a C1 or C2 cyanoalkyl group, an ammonium cation having a C1 or C2 alkoxy group, a formamidinium cation, a halogen-substituted formamidinium cation, an alkali metal ion, or a combination thereof, M is a transition metal, a rare earth metal, or a combination thereof, and X is a halide ion, a combination of two or more different halide ions, $CNS^-$, $PF_6^-$, or $BF_4^-$.

3. The quantum dot device of claim 2, wherein the ammonium cation comprises a cation represented by Chemical Formula 1a:

Chemical Formula 1a

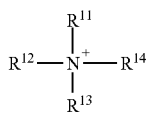

wherein, in Chemical Formula 1a,
$R^{11}$, $R^{12}$, $R^{13}$, and $R^{14}$ are each independently hydrogen, a halogen, a methyl group, an ethyl group, a methoxy group, or an ethoxy group.

4. The quantum dot device of claim 1, wherein the two-dimensional structure perovskite thin film comprises a perovskite compound represented by Chemical Formula 2:

$$AA'MX_{(4-n)}X'_n$$ Chemical Formula 2 wherein, in Chemical Formula 2,
A is an ammonium cation having a C1 or C2 alkyl group, an ammonium cation having a C1 or C2 haloalkyl group, an ammonium cation having a C1 or C2 cyanoalkyl group, an ammonium cation having a C1 or C2 alkoxy group, a formamidinium cation, a halogen-substituted formamidinium cation, an alkali metal ion, or a combination thereof, A' is an organic ammonium cation, an organic amidinium cation, an organic phosphonium cation, an organic sulfonium cation, or a derivative thereof, wherein the organic ammonium cation, the organic phosphonium cation, or the organic sulfonium cation comprises a substituted or unsubstituted C3 to C30 alkyl group, a substituted or unsubstituted C3 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, M is a transition metal, a rare earth metal, or a combination thereof, X is a halide ion, a combination of two or more different halide ions, $CNS^-$, $PF_6^-$, or $BF_4^-$, X' is a halide ion, and n is greater than 0 and less than 4.

5. The quantum dot device of claim 4, wherein
the organic ammonium cation is an amine cation, and
the amine is a primary, secondary, or tertiary aliphatic amine.

6. The quantum dot device of claim 5, wherein
the organic ammonium cation is an amine cation, and
the amine is an aromatic amine or a non-aromatic heterocyclic amine.

7. The quantum dot device of claim 5, wherein the organic ammonium cation comprises a cation represented by Chemical Formula 2a:

Chemical Formula 2a

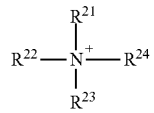

wherein, in Chemical Formula 2a,
$R^{21}$, $R^{22}$, $R^{23}$, and $R^{24}$ are each independently hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, and at least one of $R^{21}$, $R^{22}$, $R^{23}$, or $R^{24}$ is a substituted or unsubstituted C3 to C30 alkyl group, a substituted or unsubstituted C3 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group.

8. The quantum dot device of claim 5, wherein the organic ammonium cation comprises a cation represented by Chemical Formula 2aa:

Chemical Formula 2aa

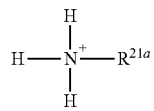

wherein, in Chemical Formula 2aa,
$R^{21a}$ is a substituted or unsubstituted C3 to C30 alkyl group, a substituted or unsubstituted C3 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group.

9. The quantum dot device of claim 5, wherein the organic amidinium cation comprises a cation represented by Chemical Formula 2b:

Chemical Formula 2b

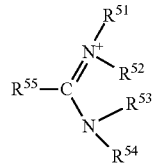

wherein, in Chemical Formula 2b,
$R^{51}$ to $R^{54}$ are each independently hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, $R^{55}$ is hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, a substituted or unsubstituted C2 to C30 heteroaryl group or $NR^xR^y$, wherein $R^x$ to $R^y$ are each independently hydrogen or a substituted or unsubstituted C1 to C10 alkyl group, and at least one of $R^{51}$, $R^{52}$, $R^{53}$, $R^{54}$, or $R^{55}$ is a substituted or unsubstituted C1 to C30 alkyl group, a substituted or unsubstituted C3 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group.

10. The quantum dot device of claim 5, wherein the organic ammonium cation comprises a cation represented by Chemical Formula 2c:

Chemical Formula 2c

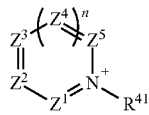

wherein, in Chemical Formula 2c, $R^{41}$ is hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, $Z^1$ to $Z^5$ are each independently $CR^a$ or N, wherein $R^a$ is hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, or adjacent $R^a$'s are linked to each other to provide a fused ring, and n is an integer of 1 to 3.

11. The quantum dot device of claim 5, wherein the organic ammonium cation comprises a cation represented by Chemical Formula 2d:

Chemical Formula 2d

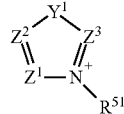

wherein, in Chemical Formula 2c, $Y^1$ is $CR^aR^b$, $NR^c$, O, S, Se, Te, or C(=O), wherein $R^a$, $R^b$, and $R^c$ are each independently hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, $R^{51}$ is hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, $Z^1$ to $Z^3$ are each independently $CR^x$ or N, wherein $R^x$ is hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, and $Y^1$ is $CR^aR^b$ or $NR^c$, and when $Z^1$ to $Z^3$ are $CR^x$, two adjacent ones of $R^a$ or $R^b$, $R^c$, and $R^x$ are linked to each other to provide a ring.

12. The quantum dot device of claim 5, wherein the organic ammonium cation comprises a cation represented by Chemical Formula 2e:

Chemical Formula 2e

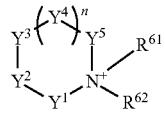

wherein, in Chemical Formula 2e, $Y^1$ to $Y^5$ are each independently $CR^aR^b$, $NR^c$, O, S, Se, Te, C=O, C=S, C=O, C=Se, or C=Te, wherein $R^a$, $R^b$, and $R^c$ is hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group or two adjacent ones of $R^a$ or $R^b$ and $R^c$ are linked to each other to provide a ring, provided that two adjacent ones of $Y^1$ to $Y^5$ are not $NR^c$, O, S, Se, Te, C=O, C=S, C=O, C=Se, or C=Te, $R^{61}$ and $R^{62}$ are each independently hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, and n is an integer of 1 to 3.

13. The quantum dot device of claim 5, wherein the organic ammonium cation is a substituted or unsubstituted pyrrolidinium cation, a substituted or unsubstituted piperidinium cation, a substituted or unsubstituted pyridinium cation, pyridazinium cation, a substituted or unsubstituted pyrimidinium cation, a substituted or unsubstituted pyrazinium cation, a substituted or unsubstituted imidazolium cation, a substituted or unsubstituted pyrazolium cation, a substituted or unsubstituted thiazolium cation, a substituted or unsubstituted oxazolium cation, a substituted or unsubstituted triazolium cation, a substituted or unsubstituted piperazinium cation, a substituted or unsubstituted morpholinium cation, or a combination thereof.

14. The quantum dot device of claim 5, wherein the organic phosphonium cation comprises a cation represented by Chemical Formula 2f:

Chemical Formula 2f

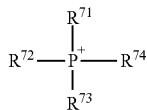

wherein, in Chemical Formula 2f, $R^{71}$, $R^{72}$, $R^{73}$, and $R^{74}$ are each independently hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, provided that at least one of $R^{71}$, $R^{72}$, $R^{73}$, or $R^{74}$ is a substituted or unsubstituted C3 to C30 alkyl group, a substituted or unsubstituted C3 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group.

15. The quantum dot device of claim 5, wherein the organic sulfonium cation comprises a cation represented by Chemical Formula 2g:

Chemical Formula 2g

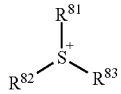

wherein, in Chemical Formula 2g, $R^{81}$, $R^{82}$, and $R^{83}$ are each independently hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group or a substituted or unsubstituted C2 to C30 heteroaryl group, provided that at least one of $R^{81}$, $R^{82}$, or $R^{83}$ is C3 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group.

16. The quantum dot device of claim 1, wherein the hole transport layer has a thickness of about 10 nanometers to about 100 nanometers.

17. The quantum dot device of claim 1, wherein a ratio of a thickness of the first hole transport layer to a thickness of the second hole transport layer is in a range of about 1.0:1 to about 9.0:1.

18. The quantum dot device of claim 1, wherein the first hole transport layer is disposed closer to the first electrode than is the second hole transport layer and the second hole transport layer is disposed closer to the quantum dot layer than is the first hole transport layer.

19. The quantum dot device of claim 1, wherein a difference between an energy bandgap of the first hole transport layer and an energy bandgap of the second hole transport layer is in a range of about 0.1 electronvolts to about 2.0 electronvolts.

20. The quantum dot device of claim 1, wherein each valence band of the first hole transport layer and the second hole transport layer is present between a work function of the first electrode and a highest occupied molecular orbital energy level of the quantum dot layer.

21. The quantum dot device of claim 1, wherein a difference between a highest occupied molecular orbital energy level of the quantum dot layer and an energy level of a valence band of the second hole transport layer is 0 electronvolts to about 1.0 electronvolts.

22. The quantum dot device of claim 1, wherein a conduction band of the second hole transport layer has an energy level that is less than a lowest unoccupied molecular orbital energy level of the quantum dot layer.

23. The quantum dot device of claim 1, wherein a difference between an energy level of a conduction band of the second hole transport layer and a lowest unoccupied molecular orbital energy level of the quantum dot layer is greater than or equal to about 0.5 electronvolts.

24. The quantum dot device of claim 1, further comprising an electron injection layer comprising inorganic nanoparticles or an organic material.

25. The quantum dot device of claim 24, wherein the inorganic nanoparticles comprise metal oxide nanoparticles represented by $Zn_{1-x}Q_xO$, wherein Q is a metal other than Zn, and $0 \leq x < 0.5$.

26. The quantum dot device of claim 1, wherein the quantum dot device further comprises a hole injection layer between the first electrode and the quantum dot layer.

27. A method of manufacturing a quantum dot device, comprising coating a first composition comprising a perovskite compound represented by Chemical Formula 1 on a first electrode and then annealing to form a first hole transport layer, coating a second composition comprising a perovskite compound represented by Chemical Formula 2' on the first hole transport layer, and then annealing to form a second hole transport layer, forming a quantum dot layer on the second hole transport layer, and forming a second electrode on the quantum dot layer to manufacture the quantum dot device, $$AMX_3 \quad \text{Chemical Formula 1}$$

wherein, in Chemical Formula 1,

A is an ammonium cation having a C1 or C2 alkyl group, an ammonium cation having a C1 or C2 haloalkyl group, an ammonium cation having a C1 or C2 cyanoalkyl group, an ammonium cation having a C1 or C2 alkoxy group, a formamidinium cation, a halogen-substituted formamidinium cation, an alkali metal ion, or a combination thereof, M is a transition metal, a rare earth metal, or a combination thereof, and X is a halide ion, a combination of two or more different halide ions, $CNS^-$, $PF_6^-$, or $BF_4^-$, Chemical Formula 2'

A'X' wherein, in Chemical Formula 2',

A' is an organic ammonium cation selected from the group consisting of a substituted or unsubstituted pyrrolidinium cation, a substituted or unsubstituted piperidinium cation, a substituted or unsubstituted pyridinium cation, pyridazinium cation, a substituted or unsubstituted pyrimidinium cation, a substituted or unsubstituted pyrazinium cation, a substituted or unsubstituted imidazolium cation, a substituted or unsubstituted pyrazolium cation, a substituted or unsubstituted thiazolium cation, a substituted or unsubstituted oxazolium cation, a substituted or unsubstituted triazolium cation, a substituted or unsubstituted piperazinium cation, a substituted or unsubstituted morpholinium cation, or a combination thereof, and X' is a halide ion.

28. The method of claim 27, wherein the first composition and second composition comprise a solvent of water, alcohol, or a combination thereof.

29. The method of claim 27, wherein the annealing is performed at a temperature of about 50° C. to about 300° C.

30. An electronic device comprising the quantum dot device of claim 1.

31. A quantum dot device, comprising a first electrode, a second electrode, a quantum dot layer disposed between the first electrode and the second electrode, and a hole transport layer disposed between the quantum dot layer and the first electrode, wherein the hole transport layer comprises a first hole transport layer including a three-dimensional structure perovskite thin film, and a second hole transport layer including a two-dimensional structure perovskite thin film, wherein the two-dimensional structure perovskite thin film comprises a perovskite compound represented by Chemical Formula 2:

$$AA'MX_{(4-n)}X'_n \quad \text{Chemical Formula 2}$$

wherein, in Chemical Formula 2,

A is an ammonium cation having a C1 or C2 alkyl group, an ammonium cation having a C1 or C2 haloalkyl group, an ammonium cation having a C1 or C2 cyanoalkyl group, an ammonium cation having a C1 or C2 alkoxy group, a formamidinium cation, a halogen-substituted formamidinium cation, an alkali metal ion, or a combination thereof, A' is an amine cation, and the amine is selected from the group consisting of a primary amine, secondary amine, or a tertiary aliphatic amine, M is a transition metal, a rare earth metal, or a combination thereof, X is a halide ion, a combination of two or more different halide ions, $CNS^-$, $PF_6^-$, or $BF_4^-$, X' is a halide ion, and n is greater than 0 and less than 4, wherein the amine cation is at least one of:

a cation represented by Chemical Formula 2a:

Chemical Formula 2a

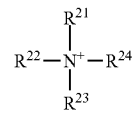

wherein, in Chemical Formula 2a, $R^{21}$, $R^{22}$, $R^{23}$, and $R^{24}$ are each independently hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, and at least one of $R^{21}$, $R^{22}$, $R^{23}$, or $R^{24}$ is a substituted or unsubstituted C3 to C30 alkyl group, a substituted or unsubstituted C3 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group;

a cation represented by Chemical Formula 2aa:

Chemical Formula 2aa

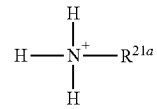

wherein, in Chemical Formula 2aa, $R^{21a}$ is a substituted or unsubstituted C3 to C30 alkyl group, a substituted or unsubstituted C3 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group;

a cation represented by Chemical Formula 2b:

Chemical Formula 2b

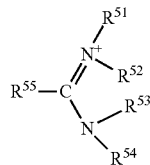

wherein, in Chemical Formula 2b,
$R^{51}$ to $R^{54}$ are each independently hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group,
$R^{55}$ is hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, a substituted or unsubstituted C2 to C30 heteroaryl group or $NR^xR^y$, wherein $R^x$ to $R^y$ are each independently hydrogen or a substituted or unsubstituted C1 to C10 alkyl group.

32. A quantum dot device, comprising
a first electrode, a second electrode, a quantum dot layer disposed between the first electrode and the second electrode, and a hole transport layer disposed between the quantum dot layer and the first electrode,
wherein the hole transport layer comprises a first hole transport layer including a three-dimensional structure perovskite thin film, and a second hole transport layer including a two-dimensional structure perovskite thin film,
wherein the two-dimensional structure perovskite thin film comprises a perovskite compound represented by Chemical Formula 2:

AA'MX$_{(4-n)}$X'$_n$      Chemical Formula 2 wherein, in Chemical Formula 2,
A is an ammonium cation having a C1 or C2 alkyl group, an ammonium cation having a C1 or C2 haloalkyl group, an ammonium cation having a C1 or C2 cyanoalkyl group, an ammonium cation having a C1 or C2 alkoxy group, a formamidinium cation, a halogen-substituted formamidinium cation, an alkali metal ion, or a combination thereof,
A' is an amine cation, and the amine is an aromatic amine or a non-aromatic heterocyclic amine,
M is a transition metal, a rare earth metal, or a combination thereof,
X is a halide ion, a combination of two or more different halide ions, CNS$^-$, PF$_6^-$, or BF$_4^-$,
X' is a halide ion, and
n is greater than 0 and less than 4.

33. The quantum device of claim 32, wherein the aromatic amine is represented by Chemical Formula 2c of Chemical Formula 2d, and the non-aromatic heterocyclic amine is represented by Chemical Formula 2e:

Chemical Formula 2c

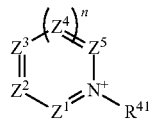

wherein, in Chemical Formula 2c,
$R^{41}$ is hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group,
$Z^1$ to $Z^5$ are each independently $CR^a$ or N, wherein $R^a$ is hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, or adjacent $R^a$'s are linked to each other to provide a fused ring, and
n is an integer of 1 to 3;

Chemical Formula 2d

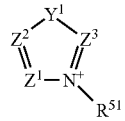

wherein, in Chemical Formula 2c,
$Y^1$ is $CR^aR^b$, $NR^c$, O, S, Se, Te, or C(=O), wherein $R^a$, $R^b$, and $R^c$ are each independently hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group,
$R^{51}$ is hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group,
$Z^1$ to $Z^3$ are each independently CR or N, wherein $R^x$ is hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, and $Y^1$ is $CR^aR^b$ or $NR^c$, and when $Z^1$ to $Z^3$ are $CR^x$, two adjacent ones of $R^a$ or $R^b$, $R^c$, and $R^x$ are linked to each other to provide a ring;

Chemical Formula 2e

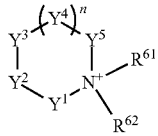

wherein, in Chemical Formula 2e, $Y^1$ to $Y^5$ are each independently $CR^aR^b$, $NR^c$, O, S, Se, Te, C=O, C=S, C=O, C=Se, or C=Te, wherein $R^a$, $R^b$, and $R^c$ is hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group or two adjacent ones of $R^a$ or $R^b$ and $R^c$ are linked to each other to provide a ring, provided that two adjacent ones of $Y^1$ to $Y^5$ are not $NR^c$, O, S, Se, Te, C=O, C=S, C=O, C=Se, or C=Te, $R^{61}$ and $R^{62}$ are each independently hydrogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C6 to C30 aryl group, a substituted or unsubstituted C7 to C30 aralkyl group, a substituted or unsubstituted C2 to C30 heterocycloalkyl group, or a substituted or unsubstituted C2 to C30 heteroaryl group, and n is an integer of 1 to 3.

* * * * *